United States Patent
Adachi

(10) Patent No.: US 8,410,671 B2
(45) Date of Patent: Apr. 2, 2013

(54) VIBRATORY ACTUATOR

(75) Inventor: Yusuke Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 330 days.

(21) Appl. No.: 12/876,271

(22) Filed: Sep. 7, 2010

(65) Prior Publication Data

US 2011/0057543 A1 Mar. 10, 2011

(30) Foreign Application Priority Data

Sep. 7, 2009 (JP) ................................ 2009-205719

(51) Int. Cl.
*H01L 41/08* (2006.01)
(52) U.S. Cl. ..................................................... 310/366
(58) Field of Classification Search .......... 310/363–366, 310/323.01–323.17, 317–319, 328, 316.01; *H01L 41/08*
See application file for complete search history.

(56) References Cited

U.S. PATENT DOCUMENTS

| | | | |
|---|---|---|---|
| 7,005,776 B1 * | 2/2006 | Iino et al. ................. | 310/316.01 |
| 7,514,843 B2 * | 4/2009 | Nagahama et al. ........... | 310/317 |
| 7,545,085 B2 * | 6/2009 | Adachi ......................... | 310/365 |
| 2004/0189155 A1 * | 9/2004 | Funakubo ..................... | 310/366 |
| 2008/0278033 A1 | 11/2008 | Adachi et al. | |

FOREIGN PATENT DOCUMENTS

JP 2008-278710 11/2008

* cited by examiner

*Primary Examiner* — Thomas Dougherty
*Assistant Examiner* — Karen B Addison
(74) *Attorney, Agent, or Firm* — Renner, Otto, Boisselle & Sklar, LLP

(57) ABSTRACT

An ultrasonic actuator includes an actuator body configured by alternately stacking piezoelectric layers, and a positive and a negative electrode layers. The positive electrode layer includes a first through a fourth positive split electrodes and a positive diagonal-connection electrode connecting together the first and the third positive split electrodes. The second and the fourth positive split electrodes are connected together outside the positive electrode layer. The negative electrode layer includes a first through a fourth negative split electrodes and a negative diagonal-connection electrode connecting together the first and the third negative split electrodes. The second and the fourth negative split electrodes are connected together outside the negative electrode layer.

10 Claims, 15 Drawing Sheets

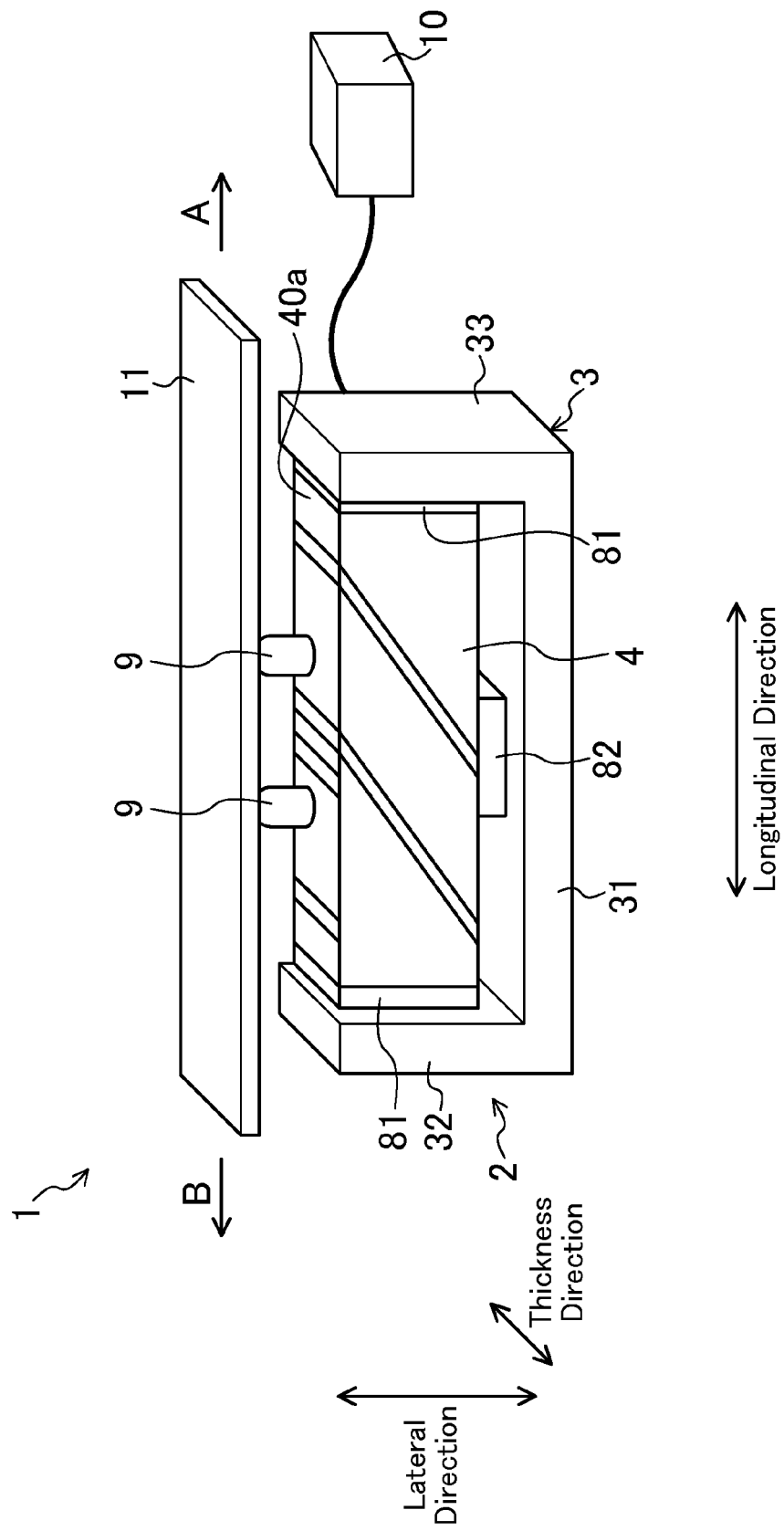

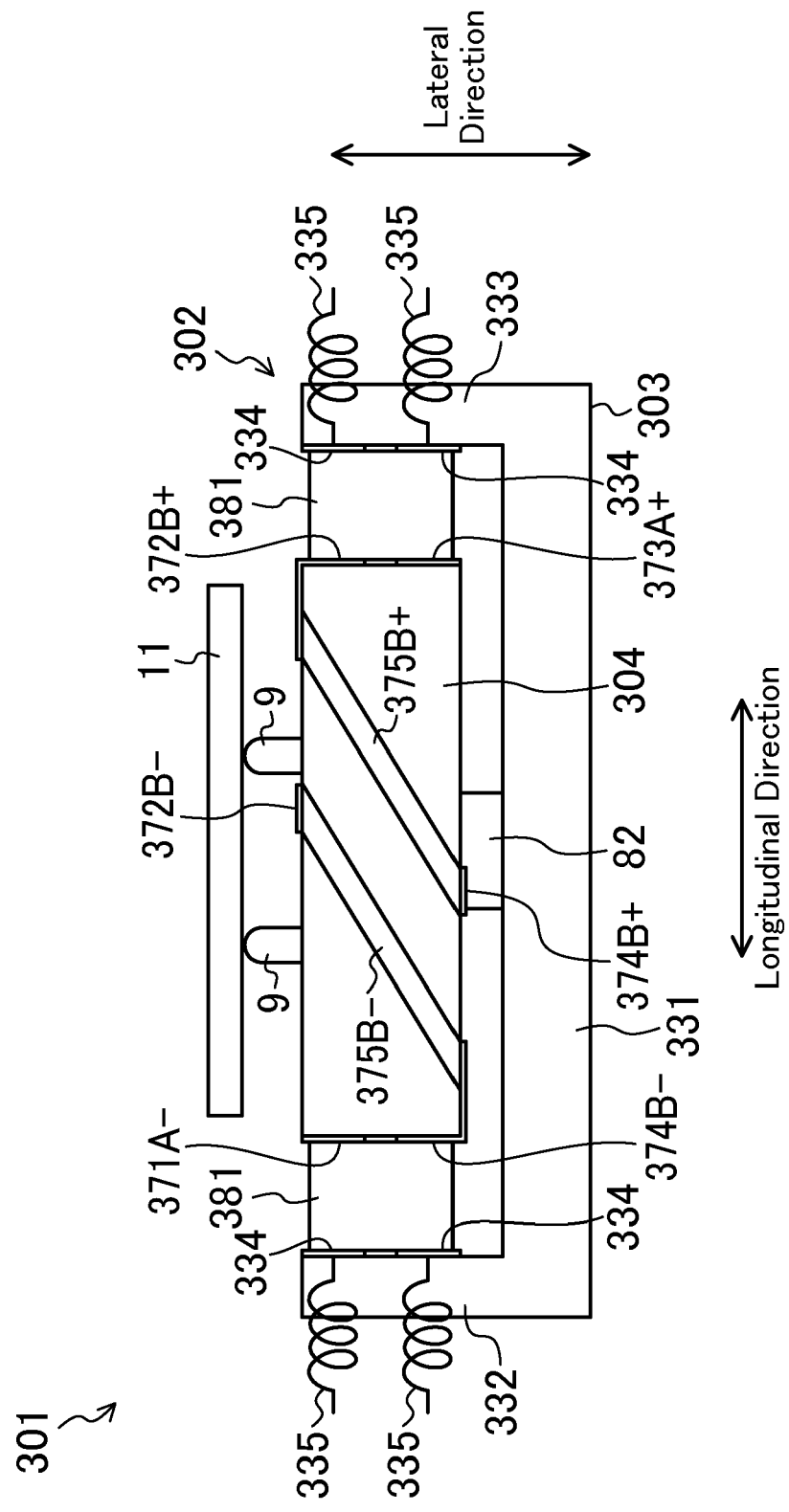

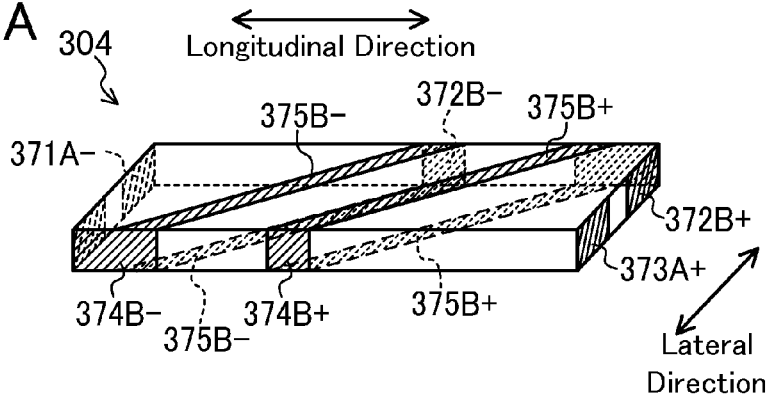
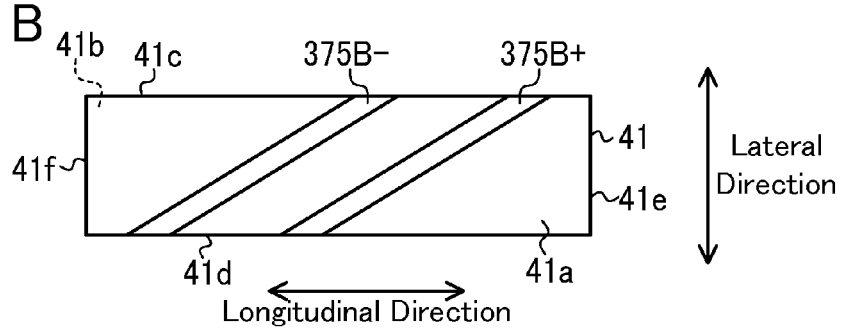
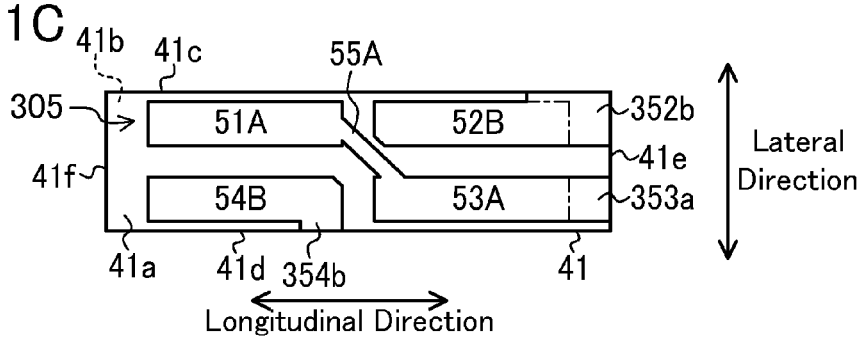
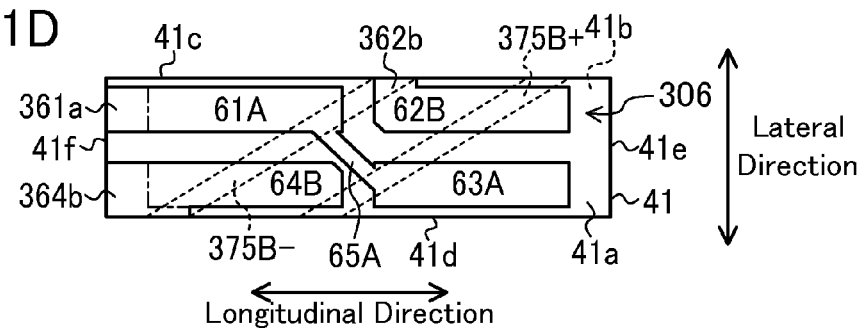

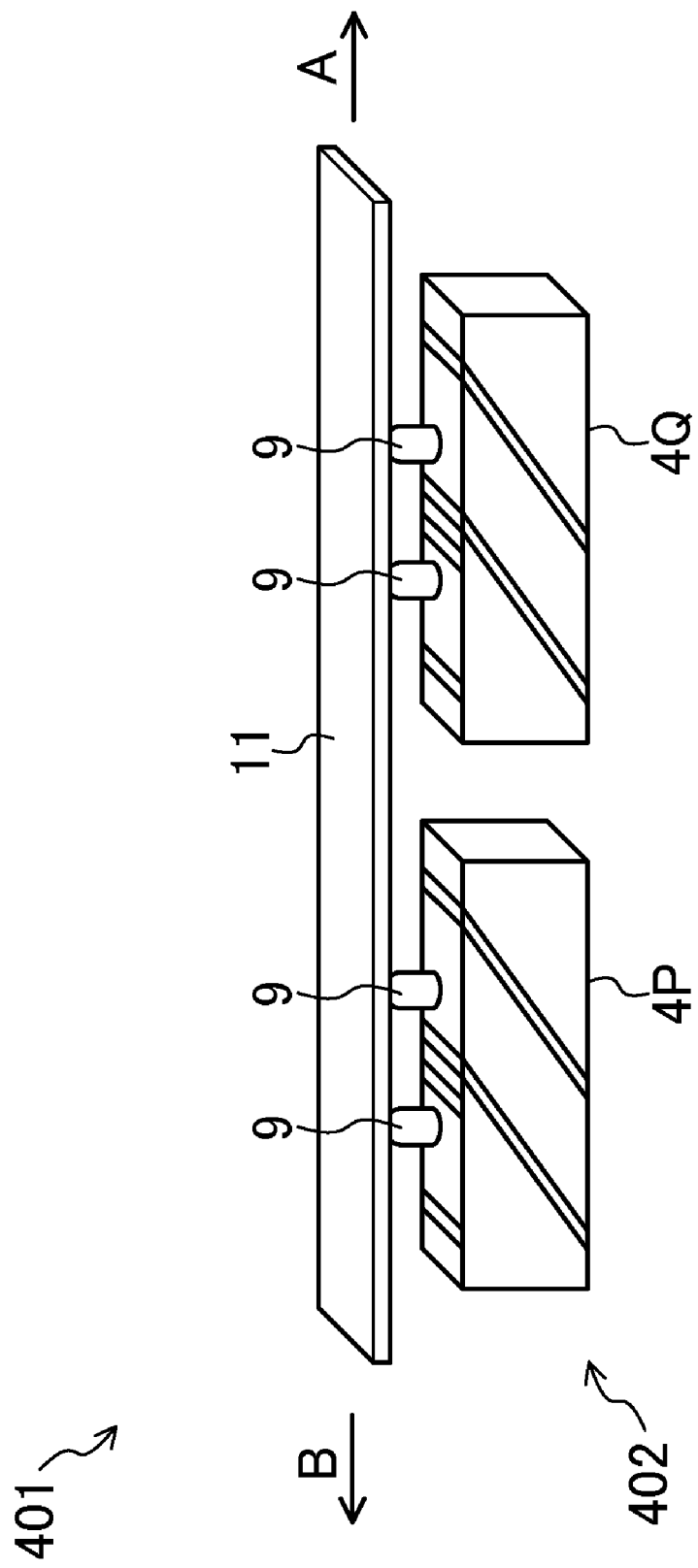

VIBRATORY ACTUATOR

CROSS-REFERENCE TO RELATED APPLICATION

This application claims priority to Japanese Patent Application No. 2009-205719 filed on Sep. 7, 2009, the disclosure of which including the specification, the drawings, and the claims is hereby incorporated by reference in its entirety.

BACKGROUND

The present invention relates to a vibratory actuator having a piezoelectric element.

Vibratory actuators having piezoelectric elements (electromechanical transducer elements) used for various electric devices have been known. This type of a vibratory actuator includes a piezoelectric element having piezoelectric layers and electrode layers provided so as to interpose the respective piezoelectric layers therebetween. In the vibratory actuator, an electric field is applied to the piezoelectric layers to induce desired vibration in the piezoelectric layers, and thus driving force is output.

Examples of such vibratory actuators includes a vibratory actuator in which an electrode layer provided on one of the principal surfaces of a piezoelectric layer is configured by four split electrodes disposed in four regions which are obtained by halving the principal surface respectively in the longitudinal and the lateral directions, and an electrode layer provided on the other principal surface of the piezoelectric layer is also configured by four split electrodes in a similar way.

For example, a vibratory actuator according to Japanese Patent Publication No. 2008-278710 (referred to hereinafter as Patent Document 1) includes four split electrodes, such as one described above, on one and the other principal surfaces of a piezoelectric layer in order to induce a first-order mode of expanding/contracting vibration (stretching vibration, or longitudinal vibration) and a second-order mode of bending vibration (lateral vibration) in the piezoelectric layer by full-bridge driving or push-pull driving.

In the piezoelectric element having such split electrodes, in order to supply power to eight split electrodes in total on the both principal surfaces of a piezoelectric layer, each of these eight split electrodes needs to be connected to a connection line such as a wire or a flexible cable. In this case, each connection line acts as a load and thus disturbs vibration of the piezoelectric element, which may reduce the efficiency of vibratory actuator.

Therefore, a vibratory actuator described in Patent Document 1 has a configuration in which two split electrodes disposed along a diagonal direction, among the split electrodes in a same electrode layer, are connected together approximately at the center of the electrode layer using a connection electrode expanding in the diagonal direction. Since a same drive voltage is applied to the two split electrodes disposed along a diagonal direction in a same electrode layer, such connection in the same electrode layer allows the connection lines for one split electrode to be eliminated.

However, if the two split electrodes disposed along a diagonal direction in each electrode layer are connected together using a connection electrode expanding in the diagonal direction, only the two split electrodes disposed along one diagonal direction can be connected together in one electrode layer. Each electrode layer includes two pairs of split electrodes disposed along diagonal directions, and in addition, there are two types of electrode layers: one is a positive type of electrode layer provided on one principal surface of a piezoelectric layer, and the other is a negative type of electrode layer provided on the other principal surface of the piezoelectric layer. Thus, a piezoelectric element included in a vibratory actuator described in Patent Document 1 is configured by alternately stacking a plurality of piezoelectric layers and a plurality of electrode layers, and the plurality of electrode layers includes four types of electrode layers: a positive type of electrode layers in which a pair of split electrodes disposed along one diagonal direction are connected together, a positive type of electrode layers in which a pair of split electrodes disposed along the other diagonal direction are connected together, a negative type of electrode layers in which a pair of split electrodes disposed along one diagonal direction are connected together, and a negative type of electrode layers in which a pair of split electrodes disposed along the other diagonal direction are connected together.

In this way, by connecting split electrodes having a same potential together in a same electrode layer, the number of connection lines to the piezoelectric element is reduced.

SUMMARY

However, a need for various patterns of electrode layers as described above causes the manufacturing process of vibratory actuators to be more complex and the manufacturing cost to be increased. For example, when electrode layers are printed on principal surfaces of piezoelectric layers to manufacture a piezoelectric element, many types of screen printing plates etc. need to be prepared in order to print the electrode layers on the surfaces of piezoelectric layers. Moreover, a facility for stacking piezoelectric layers on which the four types of electrode layers are formed becomes complex.

In view of the foregoing, it is an object of the present invention to reduce the number of patterns of electrode layers included in a piezoelectric element.

A vibratory actuator disclosed herein is a vibratory actuator having a piezoelectric element configured by alternately stacking a plurality of piezoelectric layers and a plurality of electrode layers. Each of the piezoelectric layers includes a pair of principal surfaces and side surfaces formed along the periphery of the pair of principal surfaces, and is polarized along a direction in which the pair of principal surfaces face each other; the plurality of electrode layers include a positive electrode layer, which serves as a positively-charged electrode when a voltage is applied in a forward direction with respect to the polarization direction of a corresponding one of the piezoelectric layers, and a negative electrode layer, which serves as a negatively-charged electrode when a voltage is applied in a forward direction with respect to the polarization direction of a corresponding one of the piezoelectric layers; the positive electrode layer includes four positive split electrodes respectively provided in four regions obtained by halving a principal surface of the piezoelectric layer respectively in the longitudinal and the lateral directions thereof, and a positive diagonal-connection electrode connecting together a first pair of positive split electrodes disposed along one diagonal direction among the four positive split electrodes, and a second pair of positive split electrodes, which are not connected together by the positive diagonal-connection electrode among the four positive split electrodes, are connected together outside the positive electrode layer; and the negative electrode layer includes four negative split electrodes opposed to the four positive split electrodes of the positive electrode layer across the piezoelectric layer, and a negative diagonal-connection electrode connecting together a first pair of negative split electrodes disposed along one diagonal direction among the four negative split electrodes, and a second pair of negative split electrodes, which are not connected together by the negative diagonal-connection electrode among the four negative split electrodes, are connected together outside the negative electrode layer.

According to the vibratory actuator described above, in each positive electrode layer, a pair of positive split electrodes disposed along one diagonal direction are connected together by a positive diagonal-connection electrode in the positive electrode layer, and the other pair of positive split electrodes disposed along the other diagonal direction are connected together outside the positive electrode layer, thereby allowing each positive electrode layer to be configured using only one pattern. Similarly, in each negative electrode layer, a pair of negative split electrodes disposed along one diagonal direction are connected together by a negative diagonal-connection electrode in the negative electrode layer, and the other pair of negative split electrodes disposed along the other diagonal direction are connected together outside the negative electrode layer, thereby allowing each negative electrode layer to be configured using only one pattern. Thus, the number of patterns of electrode layers can be reduced.

BRIEF DESCRIPTION OF THE DRAWINGS

FIG. 1 is a perspective view of a drive unit according to the first embodiment of the present invention.

FIG. 2A is a perspective view of the actuator body, and FIGS. 2B-2D are plan views of respective piezoelectric layers having electrode layers provided on principal surfaces, as viewed from one side of the stacking direction.

FIG. 10 is a front view of a drive unit according to the third embodiment.

FIGS. 11A-11D are diagrams illustrating a configuration of an actuator body. FIG. 11A is a perspective view of the actuator body, and FIGS. 11B-11D are plan views of respective piezoelectric layers having electrode layers provided on principal surfaces, as viewed from one side of the stacking direction.

FIG. 12 is a perspective view of a drive unit according to the fourth embodiment.

FIG. 20A is a perspective view of the actuator body, FIGS. 20B-20D are plan views of respective piezoelectric layers having electrode layers provided on principal surfaces, as viewed from one side of the stacking direction, and FIG. 20E is a front view of the actuator body.

DETAILED DESCRIPTION

Figure 2A:
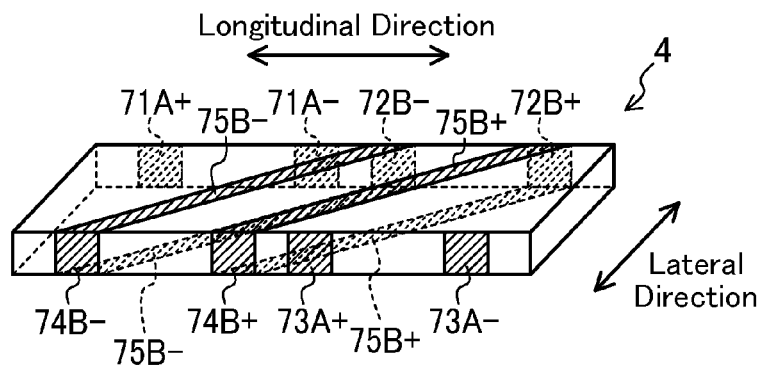
FIGS. 2A-2D are diagrams illustrating a configuration of an actuator body.

Example embodiments of the present invention will be described below in detail with reference to the drawings.

First Embodiment

FIG. 1 is a schematic configuration diagram of a drive unit 1 according to a first embodiment. As shown in FIG. 1, the drive unit 1 according to the first embodiment of the present invention includes a stage 11, an ultrasonic actuator 2, and a control unit 10 for providing drive control of the ultrasonic actuator 2.

The stage 11 is slidably attached to guides (not shown). That is, the stage 11 is configured to be movable along the directions in which the guides extend (the directions shown by the arrows A and B in the figure) (the directions in which the guides extend correspond to the directions of movement of the stage 11). The stage 11 is a plate member which is generally rectangular-shaped as viewed from the top. The ultrasonic actuator 2 is placed so that driver elements 9 (described later) contact with a back surface of the stage 11.

The ultrasonic actuator 2 includes an actuator body 4 for producing vibration, driver elements 9 for transmitting driving force of the actuator body 4 to the stage 11, a case 3 for housing the actuator body 4, rubber supports 81 provided between the actuator body 4 and the case 3 for elastically supporting the actuator body 4, and a rubber biasing member 82 for biasing the actuator body 4 toward the stage 11. The ultrasonic actuator 2 serves as a vibratory actuator.

The actuator body 4 includes a piezoelectric element. The actuator body 4 has a generally rectangular parallelepiped shape, which includes a pair of principal surfaces facing each other, each having a generally rectangular shape, a pair of longer side surfaces facing each other, orthogonal to the principal surfaces and extending along the longitudinal directions of the principal surfaces, and a pair of shorter side surfaces facing each other, orthogonal to both the principal surfaces and the longer side surfaces and extending along the lateral directions of the principal surfaces. The principal surfaces have the largest areas of the principal surfaces, the longer side surfaces, and the shorter side surfaces. The longer and the shorter side surfaces constitute the side surfaces formed along the periphery of the principal surfaces. The actuator body 4 harmonically produces stretching vibration and bending vibration, as will be described later in detail.

Two driver elements 9 are provided on a longer side surface (also referred to hereinafter as "mounting surface") 40a of the actuator body 4.

Each of the driver elements 9 has a cylindrical shape, and the top end of each driver element 9 has a hemispherical shape. The driver elements 9 are made of material such as zirconia, alumina, silicon nitride, silicon carbide, or tungsten carbide. The driver elements 9 are attached to the mounting surface 40a of the actuator body 4 using adhesive agent.

The adhesive agent is preferably softer than the materials of the actuator body 4 and the driver elements 9. Specifically, examples of the material include synthetic resin, in particular, epoxy resin and silicone resin. The use of such materials allows the driver elements 9 to be fixed to the mounting surface 40a without disturbing the vibration of the actuator body 4 (described later).

The driver elements 9 are provided on the mounting surface 40a each at a location a distance of 30-35% of the full length of the mounting surface 40a inward from each end in the longitudinal direction of the actuator body 4. Specifically, each of these locations corresponds to an antinode of a second-order mode of bending vibration (described later) of the actuator body 4, where the amplitude of vibration reaches a maximum value.

The case 3 is made of resin, and has a generally square U-shape suitable for the actuator body 4. The case 3 includes a long-side wall portion 31, a first short-side wall portion 32 provided at one end of the long-side wall portion 31, and a second short-side wall portion 33 provided at the other end of the long-side wall portion 31.

The actuator body 4 is housed in the case 3 which is configured as described above. Specifically, the actuator body 4 is housed in the case 3 such that the longer side surface which is not provided with the driver elements 9 faces the long-side wall portion 31 of the case 3. The rubber biasing member 82 is provided between the longer side surface of the actuator body 4 and the long-side wall portion 31 of the case 3. The driver elements 9 protrude beyond the case 3. In addition, the rubber supports 81 are respectively provided between one shorter side surface of the actuator body 4 and the first short-side wall portion 32 of the case 3, and between the other shorter side surface of the actuator body 4 and the second short-side wall portion 33 of the case 3. Each of the shorter side surfaces of the actuator body 4 corresponds to an antinode of longitudinal vibration. However, since the rubber supports 81 are elastic, the rubber supports 81 can support the actuator body 4 without disturbing the longitudinal vibration of the actuator body 4.

Note that, instead of the rubber supports 81 and the rubber biasing member 82, elastic members such as plate springs may be used.

In the ultrasonic actuator 2 configured as described above, the case 3 is fixed on a base (not shown) with the driver elements 9 abutting on the back surface of the stage 11. In more detail, the ultrasonic actuator 2 is arranged so that the lateral direction of the actuator body 4 is orthogonal to the back surface of the stage 11, and the longitudinal direction of the actuator body 4 is parallel to the back surface of the stage 11, and is parallel to the direction of movement of the stage 11. In other words, the ultrasonic actuator 2 is arranged so that the vibrating direction of bending vibration of the actuator body 4 is orthogonal to the back surface of the stage 11, and the vibrating direction of longitudinal vibration of the actuator body 4 is parallel to the direction of movement of the stage 11.

In this configuration, the rubber biasing member 82 is deformed compressively. The driver elements 9 are pressed to the stage 11 by elastic force of the rubber biasing member 82. Biasing force of the ultrasonic actuator 2 toward the stage 11 depends on the elastic force of the rubber biasing member 82.

The control unit 10 receives an external operation command, and applies, to the actuator body 4, alternating voltages (AC voltages) having a common frequency according to the operation command and having a phase difference according to the operation command. That is, the control unit 10 induces longitudinal vibration and bending vibration in the actuator body 4 in a harmonized manner, and thus causes the driver elements 9 to move in orbital paths, thereby causing the stage 11 to move accordingly.

Figure 2B:
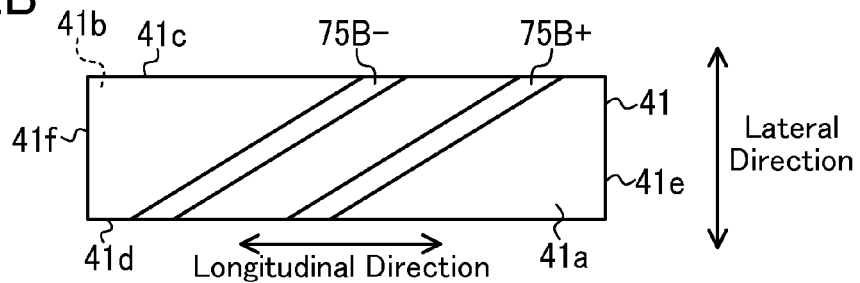
Figure 2C:
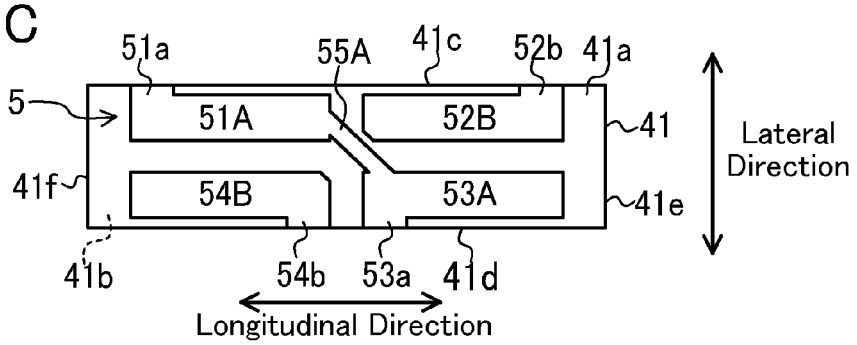
Figure 2D:
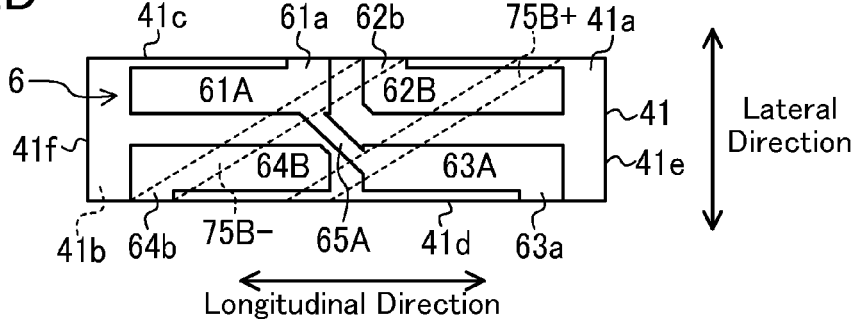
Figure 3:
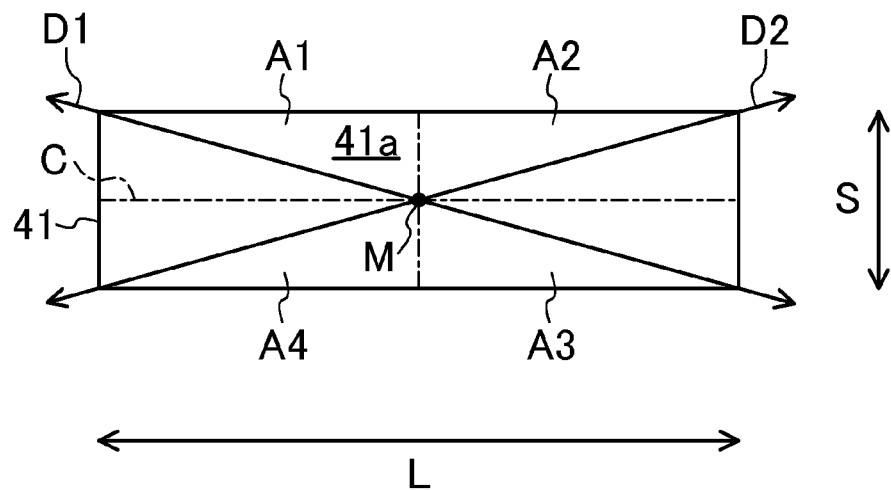
FIG. 3 is a diagram for illustrating the geometry of a piezoelectric layer.

A configuration of the actuator body 4 will be described below in more detail with reference to FIGS. 2A-2D and 3. FIGS. 2A-2D are diagrams illustrating a configuration of the actuator body 4. FIG. 2A is a perspective view of the actuator body 4, and FIGS. 2B-2D are plan views of respective piezoelectric layers having electrode layers provided on principal surfaces, as viewed from one side of the stacking direction. FIG. 3 is a diagram for illustrating the geometry of a piezoelectric layer.

As shown in FIGS. 2B-2D, the actuator body 4 is configured by alternately stacking a plurality of piezoelectric layers 41 and a plurality of internal electrode layers 5 and 6.

Each of the piezoelectric layers 41 is an insulator layer made of, for example, ceramic material such as lead zirconate titanate, zirconia, alumina, and silicon nitride. Similarly to the actuator body 4, each of the piezoelectric layers 41 has a generally rectangular parallelepiped shape, which includes a pair of principal surfaces 41a and 41b, a pair of longer side surfaces 41c and 41d, and a pair of shorter side surfaces 41e and 41f. The principal surfaces 41a and 41b have the largest areas of the principal surfaces 41a and 41b, the longer side surfaces 41c and 41d, and the shorter side surfaces 41e and 41f. The longer side surfaces 41c and 41d and the shorter side surfaces 41e and 41f constitute the side surfaces formed along the periphery of the pair of principal surfaces. The piezoelectric layers 41 are polarized along a direction in which the pair of principal surfaces 41a and 41b face each other (i.e., in a thickness direction).

The internal electrode layers 5 and 6 include positive electrode layers 5 and negative electrode layers 6, which are alternately arranged in the stacking direction interposing the respective piezoelectric layers 41. A same number of positive electrode layers 5 and negative electrode layers 6 are provided. Assuming single positive electrode layer 5 and single negative electrode layer 6 as one set, multiple sets of the positive electrode layers 5 and the negative electrode layers 6 are repeatedly stacked, interposing the respective piezoelectric layers 41. Each of the positive electrode layers 5 and the negative electrode layers 6 is an electrode layer made of, for example, metal made primarily of silver, palladium, etc. In addition, each of the positive and the negative electrode layers 5 and 6 is printed on the principal surface 41a of each piezoelectric layer 41. The positive and the negative electrode layers 5 and 6 are electrically insulated from each other, and thus do not conduct. Note that a piezoelectric layer 41 is polarized along a direction from a corresponding positive electrode layer 5 to a corresponding negative electrode layer 6. In other words, a positive electrode layer 5 is an electrode layer which serves as a positive type, i.e., an anode, and a negative electrode layer 6 is an electrode layer which serves as a negative type, i.e., a cathode, when a voltage is applied in a forward direction with respect to the polarization direction of a corresponding one of the piezoelectric layers 41.

FIG. 2B illustrates an outermost piezoelectric layer 41; FIG. 2C illustrates a piezoelectric layer 41 having a positive electrode layer 5; and FIG. 2D illustrates a piezoelectric layer 41 having a negative electrode layer 6. Piezoelectric layers 41 having positive electrode layers 5 and piezoelectric layers 41 having negative electrode layers 6 are repeatedly stacked in the actuator body 4. The outermost layers of the actuator body 4 are configured such that neither positive electrode layer 5 nor negative electrode layer 6 is exposed. Specifically, one of the outermost layers of the actuator body 4 includes a piezoelectric layer 41 having neither positive electrode layer 5 nor negative electrode layer 6 thereon, covering the positive electrode layer 5 of the second outermost piezoelectric layer 41. Meanwhile, the other outermost layer on the opposite side includes a piezoelectric layer 41 having a negative electrode layer 6. This means that another piezoelectric layer 41 having neither positive electrode layer 5 nor negative electrode layer 6 thereon is not provided. That is, this negative electrode layer 6 is provided on the principal surface 41a, which faces the second outermost piezoelectric layer 41, of the principal surfaces 41a and 41b of the other outermost piezoelectric layer 41, and thus the negative electrode layer 6 is not exposed to the outside world. Therefore, the other outermost layer on the opposite side is formed by a piezoelectric layer 41 having a negative electrode layer 6. Note that although a positive and a negative external-connection electrodes 75B+ and 75B− (described later) are shown in the piezoelectric layer 41 in FIG. 2D, the positive and the negative external-connection electrodes 75B+ and 75B− are only provided on the outermost piezoelectric layers 41. That is, a piezoelectric layer 41 having a negative electrode layer 6 other than the outermost piezoelectric layers 41 has neither positive external-connection electrode 75B+ nor negative external-connection electrode 75B− thereon.

As shown in FIG. 3, the principal surface 41a of the piezoelectric layer 41 each has four regions A1-A4 which are obtained by halving the principal surface 41a respectively in the longitudinal direction L and the lateral direction S. The positive electrode layers 5 each includes positive split electrodes 51A, 52B, 53A, and 54B (hereinafter also denoted as 51A-54B) respectively provided on the four regions A1-A4 of a corresponding piezoelectric layer 41, and a positive diagonal-connection electrode 55A for connecting a pair of the positive split electrodes 51A and 53A of the two pairs of the positive split electrodes (the four positive split electrodes) disposed along the respective diagonal directions. Specifically, the four positive split electrodes 51A-54B are electrodes each having a generally rectangular shape. The four positive split electrodes 51A-54B are configured by the first positive split electrode 51A shown in the upper left in FIG. 2C, the second positive split electrode 52B, the third positive split electrode 53A, and the fourth positive split electrode 54B, arranged in a clockwise direction from the first positive split electrode 51A. The first to the fourth positive split electrodes 51A-54B constitute positive split electrodes. In addition, the first and the third positive split electrodes 51A and 53A constitute a first pair of positive split electrodes, and the second and the fourth positive split electrodes 52B and 54B constitute a second pair of positive split electrodes.

The first and the third positive split electrodes 51A and 53A disposed along one diagonal direction D1 are connected together by the positive diagonal-connection electrode 55A. The positive diagonal-connection electrode 55A is connected to the short side facing the second positive split electrode 52B, of the four sides of the first positive split electrode 51A, and to the long side facing the second positive split electrode 52B, of the four sides of the third positive split electrode 53A. That is, the positive diagonal-connection electrode 55A is positioned nearer to the second positive split electrode 52B with respect to a line connecting corners facing each other of the first and the third positive split electrodes 51A and 53A. Meanwhile, the second and the fourth positive split electrodes 52B and 54B are not connected together in the positive electrode layer 5.

Moreover, the positive split electrodes 51A-54B respectively have positive lead electrodes 51a-54b extending to the periphery of the piezoelectric layer 41 (specifically, the corresponding long side of the piezoelectric layer 41). In detail, a first and a second positive lead electrodes 51a and 52b respectively extend from long sides of the first and the second positive split electrode 51A and 52B to the adjacent long side of the piezoelectric layer 41. The first and the second positive lead electrodes 51a and 52b are provided at relatively outward locations in the longitudinal direction of the piezoelectric layer 41. In addition, a third and a fourth positive lead electrodes 53a and 54b respectively extend from long sides of the third and the fourth positive split electrode 53A and 54B to the adjacent long side of the piezoelectric layer 41. The third and the fourth positive lead electrodes 53a and 54b are provided at relatively central locations in the longitudinal direction of the piezoelectric layer 41.

As shown in FIG. 3, similarly to the positive electrode layers 5, the negative electrode layers 6 each includes negative split electrodes 61A, 62B, 63A, and 64B (hereinafter also denoted as 61A-64B) respectively provided on the four regions A1-A4 of the principal surface 41a of a corresponding piezoelectric layers 41, and a negative diagonal-connection electrode 65A for connecting a pair of the negative split electrodes 61A and 63A of the two pairs of the negative split electrodes (the four negative split electrodes) disposed along the respective diagonal directions. Specifically, the four negative split electrodes 61A-64B are electrodes each having a generally rectangular shape. The four negative split electrodes 61A-64B are configured by the first negative split electrode 61A shown in the upper left in FIG. 2D, the second negative split electrode 62B, the third negative split electrode 63A, and the fourth negative split electrode 64B, arranged in a clockwise direction from the first negative split electrode 61A. The first to the fourth negative split electrodes 61A-64B constitute negative split electrodes. In addition, the first and the third negative split electrodes 61A and 63A constitute a first pair of negative split electrodes, and the second and the fourth negative split electrodes 62B and 64B constitute a second pair of negative split electrodes.

The first and the third negative split electrodes 61A and 63A disposed along one diagonal direction D1 are connected together by the negative diagonal-connection electrode 65A. The negative diagonal-connection electrode 65A is connected to the long side facing the fourth negative split electrode 64B, of the four sides of the first negative split electrode 61A, and to the short side facing the fourth negative split electrode 64B, of the four sides of the third negative split electrode 63A. That is, the negative diagonal-connection electrode 65A is positioned nearer to the fourth negative split electrode 64B with respect to a line connecting corners facing each other of the first and the third negative split electrodes 61A and 63A. Meanwhile, the second and the fourth negative split electrodes 62B and 64B are not connected together in the negative electrode layer 6.

Moreover, the negative split electrodes 61A-64B respectively have negative lead electrodes 61a-64b extending to the periphery of the piezoelectric layer 41 (specifically, the corresponding long side of the piezoelectric layer 41). In detail, a first and a second negative lead electrodes 61a and 62b respectively extend from long sides of the first and the second negative split electrode 61A and 62B to the adjacent long side of the piezoelectric layer 41. The first and the second negative lead electrodes 61a and 62b are provided at relatively central locations in the longitudinal direction of the piezoelectric layer 41. In addition, a third and a fourth negative lead electrodes 63*a* and 64*b* respectively extend from long sides of the third and the fourth negative split electrode 63A and 64B to the adjacent long side of the piezoelectric layer 41. The third and the fourth negative lead electrodes 63*a* and 64*b* are provided at relatively outward locations in the longitudinal direction of the piezoelectric layer 41.

In this way, the first positive split electrode 51A and the first negative split electrode 61A face each other; the second positive split electrode 52B and the second negative split electrode 62B face each other; the third positive split electrode 53A and the third negative split electrode 63A face each other; and the fourth positive split electrode 54B and the fourth negative split electrode 64B face each other, respectively interposing the piezoelectric layers 41 in the stacking direction. Meanwhile, the first to the fourth positive lead electrodes 51*a*-54*b* do not overlap either the first to the fourth negative split electrodes 61A-64B or the first to the fourth negative lead electrodes 61*a*-64*b* in the stacking direction. Similarly, the first to the fourth negative lead electrodes 61*a*-64*b* do not overlap either the first to the fourth positive split electrodes 51A-54B or the first to the fourth positive lead electrodes 51*a*-54*b* in the stacking direction. Thus, the portions of the piezoelectric layer 41 corresponding respectively to the first to the fourth positive lead electrodes 51*a*-54*b* and the first to the fourth negative lead electrodes 61*a*-64*b* have no electric fields generated in the thickness direction of the piezoelectric layer 41, thereby become piezoelectrically inactive.

The positive electrode layers 5 and the negative electrode layers 6 configured as described above are each point-symmetric about the center of gravity M of each piezoelectric layer 41.

Furthermore, side-connection electrodes 71A+ through 74B− for connecting together the split electrodes formed on different piezoelectric layers 41 are formed on the longer side surfaces of the piezoelectric layers 41. The side-connection electrodes 71A+ through 74B− are formed on the longer side surfaces of the piezoelectric layers 41 using a technique such as baking, thermal spraying, and sputtering of metal such as gold, silver, and palladium.

In more detail, a first positive side-connection electrode 71A+ connected to the first positive lead electrodes 51*a* of the first positive split electrodes 51A is formed in one end portion in the longitudinal direction of one longer side surface of each piezoelectric layer 41. A second positive side-connection electrode 72B+ connected to the second positive lead electrodes 52*b* of the second positive split electrodes 52B is formed in the other end portion in the longitudinal direction of the one longer side surface of each piezoelectric layer 41. A first negative side-connection electrode 71A− connected to the first negative lead electrodes 61*a* of the first negative split electrodes 61A is formed in a portion nearer to the first positive side-connection electrode 71A+ of the central portion in the longitudinal direction of the one longer side surface of each piezoelectric layer 41. A second negative side-connection electrode 72B− connected to the second negative lead electrodes 62*b* of the second negative split electrodes 62B is formed in a portion nearer to the second positive side-connection electrode 72B+ of the central portion in the longitudinal direction of the one longer side surface of each piezoelectric layer 41.

A fourth negative side-connection electrode 74B− connected to the fourth negative lead electrodes 64*b* of the fourth negative split electrodes 64B is formed in one end portion in the longitudinal direction of the other longer side surface of each piezoelectric layer 41. A third negative side-connection electrode 73A− connected to the third negative lead electrodes 63*a* of the third negative split electrodes 63A is formed in the other end portion in the longitudinal direction of the other longer side surface of each piezoelectric layer 41. A fourth positive side-connection electrode 74B+ connected to the fourth positive lead electrodes 54*b* of the fourth positive split electrodes 54B is formed in a portion nearer to the fourth negative side-connection electrode 74B− of the central portion in the longitudinal direction of the other longer side surface of each piezoelectric layer 41. A third positive side-connection electrode 73A+ connected to the third positive lead electrodes 53*a* of the third positive split electrodes 53A is formed in a portion nearer to the third negative side-connection electrode 73A− of the central portion in the longitudinal direction of the other longer side surface of each piezoelectric layer 41.

The first to the fourth positive side-connection electrodes 71A+ through 74B+ and the first to the fourth negative side-connection electrodes 71A− through 74B− constitute side-connection electrodes.

Thus, the first to the fourth positive split electrodes 51A-54B formed on different piezoelectric layers 41 have electrical continuity with each other respectively through the first to the fourth positive side-connection electrodes 71A+ through 74B+, while the first to the fourth negative split electrodes 61A-64B formed on different piezoelectric layers 41 have electrical continuity with each other respectively through the first to the fourth negative side-connection electrodes 71A− to 74B−.

In this regard, since a first positive split electrode 51A and a third positive split electrode 53A conduct through a positive diagonal-connection electrode 55A, the first positive split electrode 51A has electrical continuity not only with the first positive split electrodes 51A formed on the other piezoelectric layers 41, but also with the third positive split electrodes 53A formed on the other piezoelectric layers 41. Similarly, the third positive split electrode 53A has electrical continuity not only with the third positive split electrodes 53A formed on the other piezoelectric layers 41, but also with the first positive split electrodes 51A formed on the other piezoelectric layers 41. That is, the first and the third positive split electrodes 51A and 53A formed on different piezoelectric layers 41 conduct. Furthermore, since a first negative split electrode 61A and a third negative split electrode 63A conduct through a negative diagonal-connection electrode 65A, the first negative split electrode 61A has electrical continuity not only with the first negative split electrodes 61A formed on the other piezoelectric layers 41, but also with the third negative split electrodes 63A formed on the other piezoelectric layers 41. Similarly, the third negative split electrode 63A has electrical continuity not only with the third negative split electrodes 63A formed on the other piezoelectric layers 41, but also with the first negative split electrodes 61A formed on the other piezoelectric layers 41. That is, the first and the third negative split electrodes 61A and 63A formed on different piezoelectric layers 41 conduct.

Meanwhile, a second and a fourth positive split electrodes 52B and 54B do not conduct within a positive electrode layer 5. Similarly, a second and a fourth negative split electrodes 62B and 64B do not conduct within a negative electrode layer 6.

Accordingly, a positive external-connection electrode 75B+ is provided for connecting together the second positive side-connection electrode 72B+ connected to the second positive split electrodes 52B and the fourth positive side-connection electrode 74B+ connected to the fourth positive split electrodes 54B. The positive external-connection electrode 75B+ is provided on the principal surface having neither positive electrode layer 5 nor negative electrode layer 6 thereon, of the principal surfaces 41a and 41b of the corresponding piezoelectric layer 41. In addition, a negative external-connection electrode 75B– is provided for connecting together the second negative side-connection electrode 72B– connected to the second negative split electrodes 62B and the fourth negative side-connection electrode 74B– connected to the fourth negative split electrodes 64B. The negative external-connection electrode 75B– is provided on the principal surface having neither positive electrode layer 5 nor negative electrode layer 6 thereon, of the principal surfaces 41a and 41b of the corresponding piezoelectric layer 41. The positive and negative external-connection electrodes 75B+ and 75B– are formed on principal surfaces of the corresponding piezoelectric layers 41 using a technique such as baking, thermal spraying, and sputtering of metal such as gold, silver, and palladium.

In more detail, among all the stacked piezoelectric layers 41, the outermost piezoelectric layers 41 (i.e., the first and the last piezoelectric layers 41 as viewed in the stacking direction) include neither positive electrode layer 5 nor negative electrode layer 6 on the principal surfaces 41a, 41b facing outward (i.e., exposed). That is, neither positive electrode layer 5 nor negative electrode layer 6 is exposed on the outer surfaces of the actuator body 4 (i.e., the principal surfaces of the actuator body 4). The positive and the negative external-connection electrodes 75B+ and 75B– are formed on the outer ones of principal surfaces 41a or 41b of the both outermost piezoelectric layers 41 (i.e., the principal surfaces of the actuator body 4). The positive and the negative external-connection electrodes 75B+ and 75B– extend in parallel with each other on the outer principal surfaces 41a (41b) of each of the outermost piezoelectric layers 41. Note that the outermost piezoelectric layers 41 have thicknesses greater than those of the other piezoelectric layers 41. That is, the outermost piezoelectric layers 41 are interposed between either the positive or the negative external-connection electrode 75B+ or 75B– and either a positive or a negative electrode layer 5 or 6, and thus the electric field may partially act on the outermost piezoelectric layers 41 along the thickness direction and may produce vibration therein. Therefore, the occurrence of undesirable vibration is prevented or reduced by increasing the thicknesses of the outermost piezoelectric layers 41.

As described above, since a second positive split electrode 52B and a fourth positive split electrode 54B conduct through the positive external-connection electrodes 75B+, the second positive split electrode 52B has electrical continuity not only with the second positive split electrodes 52B formed on the other piezoelectric layers 41, but also with the fourth positive split electrodes 54B formed on the other piezoelectric layers 41. Similarly, the fourth positive split electrode 54B has electrical continuity not only with the fourth positive split electrodes 54B formed on the other piezoelectric layers 41, but also with the second positive split electrodes 52B formed on the other piezoelectric layers 41. That is, the second and the fourth negative split electrodes 52B and 54B formed on different piezoelectric layers 41 conduct. Furthermore, since a second negative split electrode 62B and a fourth negative split electrode 64B conduct through the negative external-connection electrodes 75B–, the second negative split electrode 62B has electrical continuity not only with the second negative split electrodes 62B formed on the other piezoelectric layers 41, but also with the fourth negative split electrodes 64B formed on the other piezoelectric layers 41. Similarly, the fourth negative split electrode 64B has electrical continuity not only with the fourth negative split electrodes 64B formed on the other piezoelectric layers 41, but also with the second negative split electrodes 62B formed on the other piezoelectric layers 41. That is, the second and the fourth negative split electrodes 62B and 64B formed on different piezoelectric layers 41 conduct.

In the actuator body 4 configured as described above, the side-connection electrodes 71A+ through 74B– and the external-connection electrodes 75B+ and 75B– are externally exposed. The actuator body 4 is supplied with power through the side-connection electrodes 71A+ through 74B– and the external-connection electrodes 75B+ and 75B– as power terminals. Specifically, application of voltage across the first or the third positive side-connection electrodes 71A+ or 73A+ and the first or the third negative side-connection electrodes 71A– or 73A– allows an electric field to be applied to the portions respectively interposed between the first and the third positive split electrodes 51A and 53A and the first and the third negative split electrodes 61A and 63A of the piezoelectric layers 41. Application of voltage across the second or the fourth positive side-connection electrodes 72B+ or 74B+ and the second or the fourth negative side-connection electrodes 72B– or 74B– allows an electric field to be applied to the portions respectively interposed between the second and the fourth positive split electrodes 52B and 54B and the second and the fourth negative split electrodes 62B and 64B of the piezoelectric layers 41.

Figure 4:
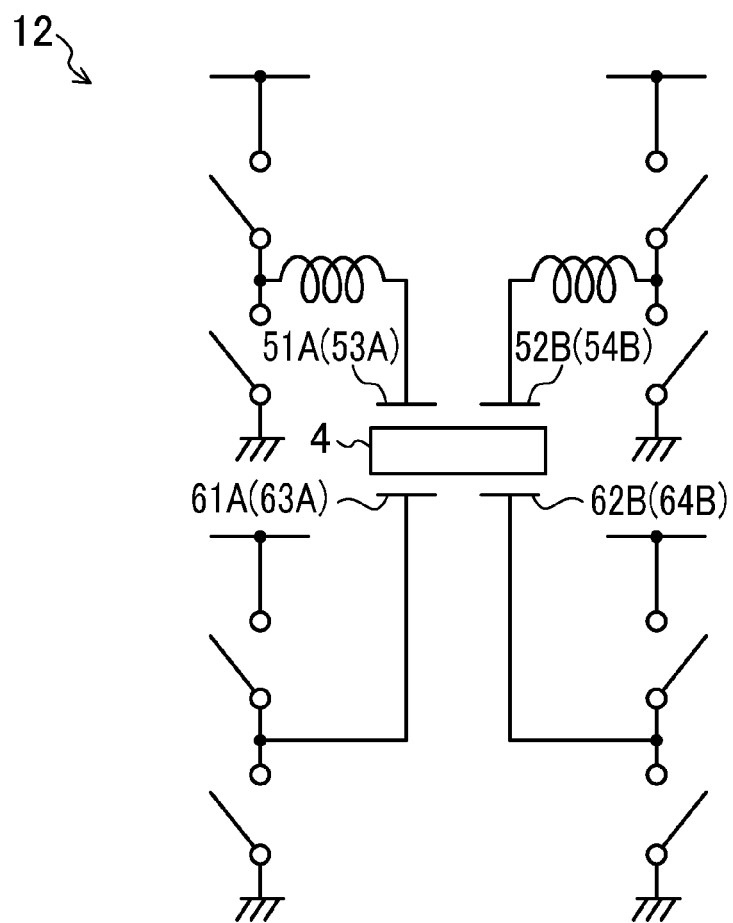
FIG. 4 is a circuit diagram of a full-bridge circuit which forms a part of a drive unit.
Figure 5:
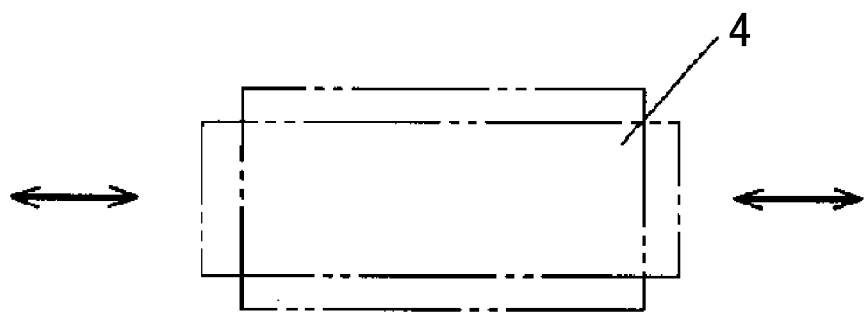
FIG. 5 is a conceptual diagram illustrating the displacement of an actuator body caused by a first-order mode of stretching vibration.
Figure 6:
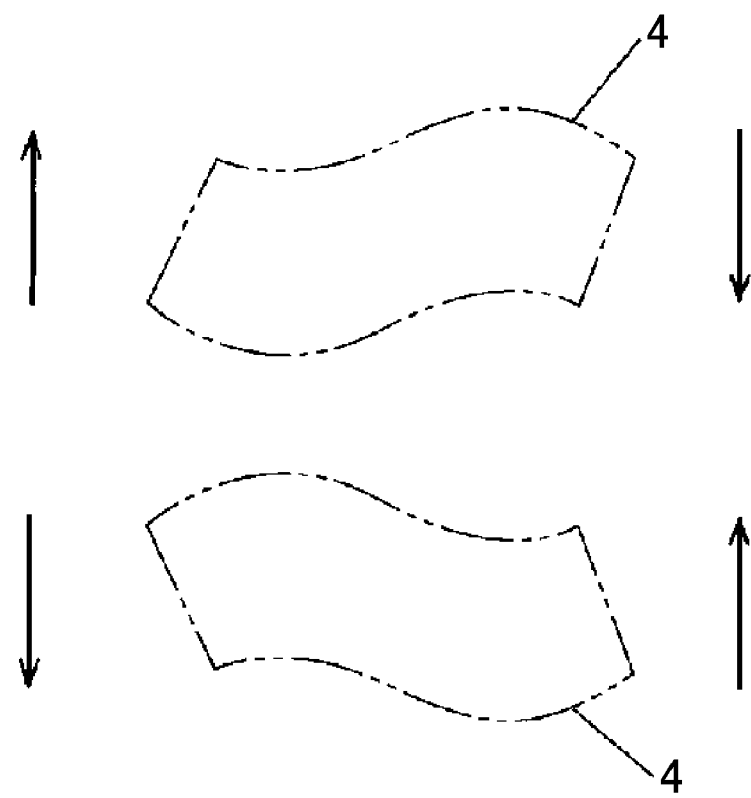
FIG. 6 is a conceptual diagram illustrating the displacement of an actuator body caused by a second-order mode of bending vibration.
Figure 7A:
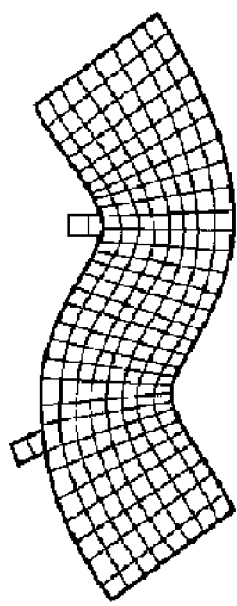
FIGS. 7A-7D are conceptual diagrams illustrating the displacements of an actuator body caused by composite vibration of a first-order mode of stretching vibration and a second-order mode of bending vibration.
Figure 7B:
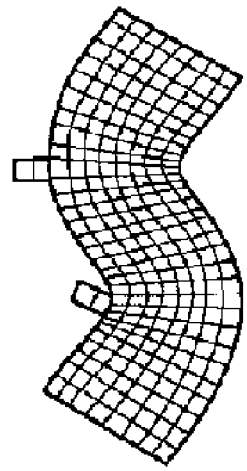
Figure 7C:
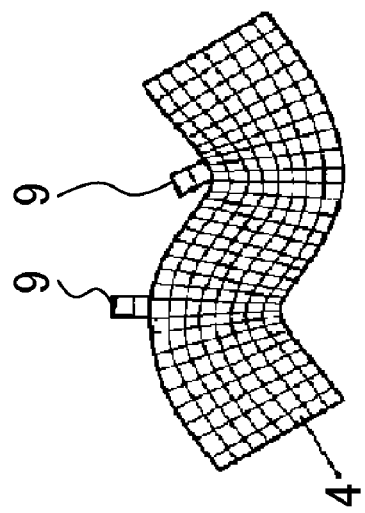
Figure 7D:
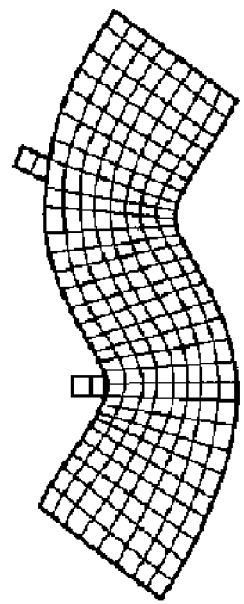

Next, the configuration and the operation of the control unit 10 will be described with reference to FIGS. 4-6 and 7A-7D. FIG. 4 is a circuit diagram of a full-bridge circuit which forms a part of the control unit 10. FIG. 5 is a displacement diagram illustrating a first-order mode of stretching vibration of the actuator body 4. FIG. 6 is a displacement diagram illustrating a second-order mode of bending vibration of the actuator body 4. FIGS. 7A-7D are displacement diagrams illustrating composite vibration of a first-order mode of stretching vibration and a second-order mode of bending vibration of the actuator body 4.

A full-bridge circuit 12 includes a plurality of FETs, which function as switching circuits, and two coils. The control unit 10 applies predetermined AC voltages to the actuator body 4 by switching the FETs by a CPU (not shown). The output terminals of the full-bridge circuit 12 are respectively connected to the third positive and negative side-connection electrodes 73A+ and 73A– and the fourth positive and negative side-connection electrodes 74B+ and 74B– of the actuator body 4 through electric wires. FIG. 4 shows the split electrodes 51A-64B having electrical continuity with the side-connection electrodes 73A+ through 74B–. Note that the full-bridge circuit 12 may be configured such that the output terminals thereof are respectively connected to the first positive side-connection electrodes 71A+ instead of the third positive side-connection electrodes 73A+, the first negative side-connection electrodes 71A– instead of the third negative side-connection electrodes 73A–, the second positive side-connection electrode 72B+ or the positive external-connection electrodes 75B+ instead of the fourth positive side-connection electrode 74B+, and the second negative side-connection electrode 72B– or the negative external-connection electrodes 75B– instead of the fourth negative side-connection electrode 74B–.

Then, the control unit 10 applies a predetermined first AC voltage across the first and the third positive split electrodes 51A and 53A and the first and the third negative split electrodes 61A and 63A through the third positive and negative side-connection electrodes 73A+ and 73A–, while the control unit 10 applies a predetermined second AC voltage across the second and the fourth positive split electrodes 52B and 54B and the second and the fourth negative split electrodes 62B and 64B through the fourth positive and negative side-connection electrodes 74B+ and 74B−. The control unit 10 induces various patterns of vibration in the actuator body 4 by adjusting the voltage values, the frequencies, and the phases of the first and the second AC voltages. For example, if a first and a second AC voltages having nearly a same voltage value, nearly a same frequency, and a same phase are applied to the actuator body 4, a first-order mode of stretching vibration shown in FIG. 5 is induced in the actuator body 4. Meanwhile, if a first and a second AC voltages having nearly a same voltage value, nearly a same frequency, and a phase difference of 180° are applied to the actuator body 4, a second-order mode of bending vibration shown in FIG. 6 is induced in the actuator body 4.

Respective resonance frequencies of stretching vibration and bending vibration of the actuator body 4 depend on the material, shape, etc. of the actuator body 4. In this embodiment, the material, shape, etc. of the actuator body 4 have been determined so that the resonance frequencies of the first-order mode of stretching vibration and of the second-order mode of bending vibration are almost the same.

In this configuration, if the control unit 10 applies to the actuator body 4 a first and a second AC voltages having nearly a same voltage value, nearly a same frequency as the resonance frequencies of the first-order mode of stretching vibration and of the second-order mode of bending vibration, and a phase difference of 90° or −90°, the first-order mode of stretching vibration and the second-order mode of bending vibration are harmonically induced in the actuator body 4, and thus the shape of the actuator body 4 changes in order as shown in FIGS. 7A-7D. Accordingly, the driver elements 9 provided on the actuator body 4 each performs orbital movement (specifically, generally elliptical movement) as viewed in the direction into the paper of FIGS. 7A-7D. That is, composite vibration of stretching vibration and bending vibration of the actuator body 4 causes the driver elements 9 to move in generally elliptical paths. This elliptical movement causes the stage 11 contacted by the driver elements 9 to move relative to the actuator body 4 in a direction of the arrow A or B shown in FIG. 1. Note that, in order to prevent excessive heat generation in the actuator body 4, AC voltages having a slightly higher frequency than a resonance frequency common to longitudinal vibration and bending vibration of the actuator body 4 may be applied.

In this regard, the expanding/contracting direction of stretching vibration is the longitudinal direction of the principal surfaces of the actuator body 4—the direction of movement of the stage 11; the vibratory direction of bending vibration is the direction in which the driver elements 9 press the stage 11. The stacking direction of the actuator body 4 is orthogonal to both the expanding/contracting direction of stretching vibration and the vibratory direction of bending vibration.

Note that the amount of movement, moving speed, and acceleration of movement of the stage 11 can be adjusted by a method such as adjusting at least one of the voltage value, frequency, and power supply period of time of the AC voltages supplied, or changing a phase difference between the AC voltages supplied.

In this way, the ultrasonic actuator 2 drives the stage 11 by causing each of the driver elements 9 to move in an orbital path in a plane including the vibratory direction of longitudinal vibration (longitudinal direction) and the vibratory direction of bending vibration (lateral direction), thereby causing the friction force between the driver elements 9 and the stage 11 to repeatedly increase and decrease.

As a specific example, it is assumed that the actuator body 4 has a rectangular parallelepiped shape of 6.0 mm (length) by 1.7 mm (width) by 1.0 mm (thickness), that switching is performed at 270 kHz by a CPU of the control unit 10, and that a first and a second AC voltages of ±3 V are applied to the actuator body 4. The phase difference of the first and the second AC voltages is 90°. In this case, the voltage applied to the actuator body 4 is 6 Vpp, and the moving speed of the stage 11 under no-load condition is 90 mm/s.

Figure 8:
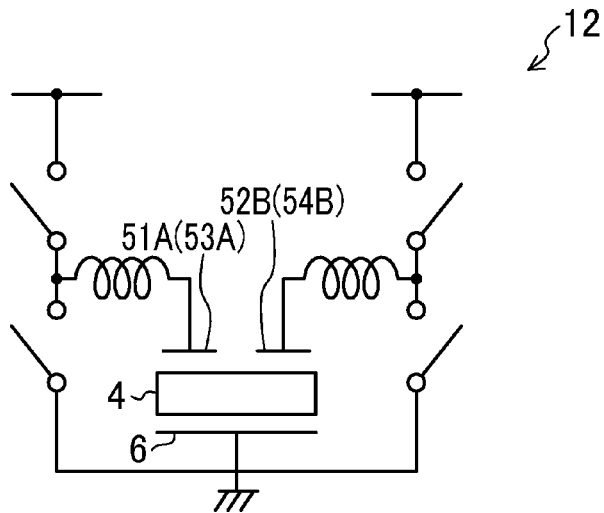
FIG. 8 is a circuit diagram of a half-bridge circuit.

Meanwhile, if, as shown in FIG. 8, each of the negative electrode layers 6 of the actuator body 4 is not divided in four, but remains in a single common electrode, and thus the control unit 10 is configured using a half-bridge circuit, then when a first and a second AC voltages of 3 Vpp having a phase difference of 90° are applied to the actuator body 4, the moving speed of the stage 11 under no-load condition is 50 mm/s.

Therefore, according to this embodiment, the connection between a pair of split electrodes disposed along one diagonal direction, of the four split electrode in each electrode layer, by a diagonal-connection electrode in the electrode layer, and the connection between the other pair of split electrodes disposed along the other diagonal direction outside of the electrode layer allow the number of patterns of electrode layers to be reduced.

In detail, in an actuator body 4 having four split electrodes disposed in the respective regions obtained by dividing the principal surface 41a of each of the piezoelectric layers 41 in four in a crisscross pattern for implementing a full-bridge circuit, each pair of split electrodes disposed along a diagonal direction need to be supplied with same AC voltages. For example, a predetermined first AC voltage needs to be applied to both the first and the third positive split electrodes 51A and 53A disposed along one diagonal direction D1 of a positive electrode layer 5, and a predetermined second AC voltage needs to be applied to both the second and the fourth positive split electrodes 52B and 54B disposed along the other diagonal direction D2 of the positive electrode layer 5. Accordingly, by connecting each pair of split electrodes disposed along a diagonal direction together, application of a predetermined AC voltage to only one of the two split electrodes disposed along a diagonal direction allows the same AC voltage to be also applied to the other one of the two split electrodes disposed along the diagonal direction. In an actuator body 4 including four split electrodes disposed in the respective regions obtained by dividing the principal surface 41a of each of the piezoelectric layers 41 in four, and applied to a full-bridge circuit, there are four types of pairs of split electrodes to be connected together: (i) the first and the third positive split electrodes 51A and 53A disposed along one diagonal direction D1 of a positive electrode layer 5, (ii) the second and the fourth positive split electrodes 52B and 54B disposed along the other diagonal direction D2 of the positive electrode layer 5, (iii) the first and the third negative split electrodes 61A and 63A disposed along one diagonal direction D1 of a negative electrode layer 6, and (iv) the second and the fourth negative split electrodes 62B and 64B disposed along the other diagonal direction D2 of the negative electrode layer 6. In this regard, a diagonal-connection electrode extending along the diagonal direction D1 and a diagonal-connection electrode extending along the diagonal direction D2 would intersect, thus only one pair of split electrodes disposed along one diagonal direction can be connected together in each electrode layer. Therefore, similarly to a vibratory actuator of Patent Document 1, connection of the respective pairs of split electrodes to be connected together using diagonal-connection electrodes in an electrode layer requires four patterns of electrode layers corresponding to the four types of pairs of split electrodes to be connected together.

On the contrary, in this embodiment, regarding a positive electrode layer 5, the first and the third positive split electrodes 51A and 53A disposed along one diagonal direction D1 are connected together by the positive diagonal-connection electrode 55A, while the second and the fourth positive split electrodes 52B and 54B disposed along the other diagonal direction D2 are connected together outside the positive electrode layer 5, thus the two pairs of split electrodes disposed along the diagonal directions can be respectively connected together; therefore, the number of patterns of positive electrode layers 5 can be reduced to one. Similarly, regarding a negative electrode layer 6, the first and the third negative split electrodes 61A and 63A disposed along one diagonal direction D1 are connected together by the negative diagonal-connection electrode 65A, while the second and the fourth negative split electrodes 62B and 64B disposed along the other diagonal direction D2 are connected together outside the negative electrode layer 6, thus the two pairs of split electrodes disposed along the diagonal directions can be respectively connected together; therefore, the number of patterns of negative electrode layers 6 can be reduced to one. Accordingly, the number of patterns of electrode layers can be reduced to two in total: one for the positive electrode layers 5, and the other for the negative electrode layers 6. This allows the manufacturing cost of the ultrasonic actuator 2 to be reduced. For example, the number of screen printing plates for printing electrode layers on the principal surface 41*a* of each of the piezoelectric layers 41 can be reduced, thereby allowing the facilities for stacking piezoelectric layers on which electrode layers have been formed to be simplified, and the manufacturing cost to be reduced.

Furthermore, in this embodiment, formation of the positive and the negative electrode layers 5 and 6 each in a point-symmetrical pattern (specifically, a point-symmetrical pattern about the center of gravity M of the principal surface 41*a* of a piezoelectric layer 41) allows a common pattern for the positive and the negative electrode layers 5 and 6, thereby allowing the manufacturing cost to be further reduced. In detail, the first to the fourth positive split electrodes 51A-54B and the first to the fourth negative split electrodes 61A-64B are formed and arranged so as to be point-symmetric about the center of gravity M of the principal surface 41*a* of the piezoelectric layer 41. In addition, the first and the second positive lead electrodes 51*a* and 52*b* extending to one longer side surface of each of the piezoelectric layers 41 are disposed at relatively outward locations in the longitudinal direction of the longer side surface, and the third and the fourth positive lead electrodes 53*a* and 54*b* extending to the other longer side surface of each of the piezoelectric layers 41 are disposed at relatively central locations in the longitudinal direction of the longer side surface, while the first and the second negative lead electrodes 61*a* and 62*b* extending to the one longer side surface of each of the piezoelectric layers 41 are disposed at relatively central locations in the longitudinal direction of the longer side surface, and the third and the fourth negative lead electrodes 63*a* and 64*b* extending to the other longer side surface of each of the piezoelectric layers 41 are disposed at relatively outward locations in the longitudinal direction of the longer side surface. Moreover, the positive diagonal-connection electrode 55A is displaced toward the second positive split electrode 52B, and the negative diagonal-connection electrode 65A is displaced toward the fourth negative split electrode 64B. These configurations allow the positive and the negative electrode layers 5 and 6 to be formed in a point-symmetrical pattern about the center of gravity M of the principal surface 41*a* of the piezoelectric layer 41. Due to the point-symmetrical pattern of the positive and the negative electrode layers 5 and 6, the pattern after rotating the positive electrode layer 5 by 180° about the center of gravity M of the principal surface 41*a* of the piezoelectric layer 41 is that of the negative electrode layer 6. That is, printing one pattern of electrode layer on each of the piezoelectric layers 41, and alternately stacking a plurality of piezoelectric layers 41 having the principal surfaces 41*a* having same electrode layers printed thereon while rotating by 180° about the center of gravity M of the principal surfaces 41*a* of the piezoelectric layers 41 allow an actuator body 4 to be formed in which the piezoelectric layers 41 having the positive electrode layers 5 and the piezoelectric layers 41 having the negative electrode layers 6 are alternately stacked. Thus, since the number of patterns of screen printing plates for printing electrode layers on the principal surfaces 41*a* of the piezoelectric layers 41 can be reduced to one, the manufacturing cost can be further reduced. In addition, due to the point-symmetrical pattern of the positive and the negative electrode layers 5 and 6, symmetry of vibration—especially the second-order mode of bending vibration—of the actuator body 4 improves. This prevents undesired vibration from occurring in the actuator body 4, and thus the energy loss is significantly reduced, thereby allowing the supplied electric power to be efficiently converted to vibration.

The split electrodes which are connected together outside the electrode layers may be connected together using wires or flexible cables. However, in this embodiment, these connections are achieved by the side-connection electrodes 71A+ through 74B− and the external-connection electrodes 75B+ and 75B− provided on the surfaces of the actuator body 4. Thus, connection of the split electrodes which are connected together outside the electrode layers by the side-connection electrodes 71A+ through 74B− and the external-connection electrodes 75B+ and 75B− provided on the surfaces of the actuator body 4 prevents vibration of the actuator body 4 from being disturbed by wires or flexible cables. This prevents a decrease of efficiency of the ultrasonic actuator 2.

Moreover, in a configuration in which two of the side-connection electrodes formed on surfaces of the actuator body 4 are connected together by an external-connection electrode formed on a surface of the actuator body 4, these three connection electrodes are formed across edge portions of the actuator body 4 unless these three connection electrodes are formed on a same plane. Specifically, in this embodiment, the second positive side-connection electrode 72B+ and the positive external-connection electrodes 75B+ are connected together in the edge portions between the principal surfaces and one longer side surface of the actuator body 4. The fourth positive side-connection electrode 74B+ and the positive external-connection electrodes 75B+ are connected together in the edge portions between the principal surfaces and the other longer side surface of the actuator body 4. That is, the second positive side-connection electrode 72B+, the positive external-connection electrodes 75B+, and the fourth positive side-connection electrode 74B+ are formed across these edge portions of the actuator body 4. Similarly, the second negative side-connection electrode 72B− and the negative external-connection electrodes 75B− are connected together in the edge portions between the principal surfaces and one longer side surface of the actuator body 4. The fourth negative side-connection electrode 74B− and the negative external-connection electrodes 75B− are connected together in the edge portions between the principal surfaces and the other longer side surface of the actuator body 4. That is, the second negative side-connection electrode 72B−, the negative external-connection electrodes 75B−, and the fourth negative side-connection electrode 74B− are formed across these edge portions of the actuator body 4.

Thus, in a configuration in which electrodes are formed across edge portions of the actuator body 4, disconnection of an electrode may occur in an edge portion. Specifically, since the piezoelectric layers are made of brittle material, and edge portions chip easily, a part of an electrode may chip off together with an edge portion. Moreover, electrodes in edge portions are more difficult to have enough film thickness than electrodes formed on surfaces such as the principal surfaces and the longer side surfaces; therefore, electrodes may disconnect in edge portions due to a difference between the thermal expansion coefficient of the piezoelectric layers 41 and that of the electrodes, etc.

On this point, in this embodiment, the positive external-connection electrode 75B+ which connects together the second positive side-connection electrode 72B+ and the fourth positive side-connection electrode 74B+ is provided on each principal surface of the actuator body 4. This allows the second positive side-connection electrode 72B+ and the fourth positive side-connection electrode 74B+ to remain connected together through the other positive external-connection electrode 75B+ even if one positive external-connection electrode 75B+ is disconnected in an edge portion; therefore, the reliability of the ultrasonic actuator 2 improves.

In this regard, the arrangement order of the second positive and negative side-connection electrodes 72B+ and 72B− on the longer side surface is the same as that of the fourth positive and negative side-connection electrodes 74B+ and 74B− along the longitudinal direction of the actuator body 4. This allows the positive and negative external-connection electrodes 75B+ and 75B− to be formed without intersecting each other on the principal surfaces 41a and 41b of the corresponding piezoelectric layers 41. Accordingly, both the positive and the negative external-connection electrodes 75B+ and 75B− can be formed on one principal surface 41a (41b); therefore, both the positive and the negative external-connection electrodes 75B+ and 75B− can be formed on each of the principal surfaces 41a and 41b. That is, if it is inevitable that the positive and the negative external-connection electrodes 75B+ and 75B− intersect each other on a principal surface 41a (41b), then only either the positive or the negative external-connection electrode 75B+ or 75B− can be formed on one principal surface 41a (41b); in this case, only the positive external-connection electrode 75B+ would be formed on one principal surface 41a of the actuator body 4, and only the negative external-connection electrode 75B− would be formed on the other principal surface 41b. Accordingly, in one and the other longer side surfaces of the actuator body 4, configuring the side-connection electrodes such that the arrangement order of the second positive and negative side-connection electrodes 72B+ and 72B− is the same as that of the fourth positive and negative side-connection electrodes 74B+ and 74B− allows both the positive and the negative external-connection electrodes 75B+ and 75B− to be formed on each principal surface of the actuator body 4 (i.e., the principal surface 41a of one of the outermost piezoelectric layers 41, and the principal surface 41b of the other of the outermost piezoelectric layers 41).

However, the outermost piezoelectric layers 41 may be configured such that only the positive external-connection electrode 75B+ is formed on the outer principal surface 41a of one of the outermost piezoelectric layers 41, and only the negative external-connection electrode 75B− is formed on the outer principal surface 41b of the other of the outermost piezoelectric layers 41. In such a configuration, the electrodes intersecting edge portions may have larger widths. That is, if the outermost piezoelectric layers 41 are configured such that both the positive and the negative external-connection electrodes 75B+ and 75B− are formed on each principal surface 41a (41b), the widths of the positive and the negative external-connection electrodes 75B+ and 75B− need to be sufficiently small so as not to interfere with each other. On this point, if either the positive or the negative external-connection electrode 75B+ or 75B− is only formed on each principal surface 41a (41b), the widths of the external-connection electrodes and the side-connection electrodes connected thereto can be made larger without need for consideration of interference with the other external-connection electrode. As a result, the widths of the portions of electrodes intersecting edge portions will be larger; therefore, even if a damage etc. occurs in a portion intersecting an edge portion, it is unlikely that the electrode is completely disconnected, and therefore electrical continuity is maintained. This improves the reliability of the ultrasonic actuator 2.

The positive diagonal-connection electrodes 55A in the positive electrode layers 5 and the negative diagonal-connection electrodes 65A in the negative electrode layers 6 are arranged so as not to overlap each other as viewed in the stacking direction (i.e., the polarization direction of the piezoelectric layers 41), thereby allowing the actuator body 4 to vibrate in a balanced manner, and the vibration efficiency to be improved. Specifically, the positive diagonal-connection electrodes 55A are positioned nearer to the respective second positive split electrodes 52B in the diagonal direction D2, and the negative diagonal-connection electrodes 65A are positioned nearer to the respective fourth negative split electrodes 64B in the diagonal direction D2 so that the positive diagonal-connection electrodes 55A and the negative diagonal-connection electrodes 65A do not overlap each other in the polarization direction of the piezoelectric layers 41. This allows the portions of the piezoelectric layers 41 where the positive and the negative diagonal-connection electrodes 55A and 65A are provided to be piezoelectrically inactive, thus the occurrence of undesirable vibration can be prevented or reduced in the actuator body 4. This achieves well-balanced vibration of the actuator body 4, and thus the vibration efficiency can be improved.

However, the positive and the negative diagonal-connection electrodes 55A and 65A do not need to be completely separated from each other so as not to overlap as viewed in the stacking direction. That is, the positive and the negative diagonal-connection electrodes 55A and 65A may partially overlap each other, instead of being completely separated from each other, as viewed in the stacking direction. Even in such a configuration, the electric fields generated between the positive and the negative diagonal-connection electrodes 55A and 65A act in an oblique direction relative to the polarization direction of the piezoelectric layers 41; therefore, vibration induced in the portions of the piezoelectric layers 41 where the positive and the negative diagonal-connection electrodes 55A and 65A are provided can be reduced as compared with when the electric fields act in the same direction as the polarization direction.

Furthermore, the first to the fourth positive lead electrodes 51a-54b in the positive electrode layers 5 and the first to the fourth negative lead electrodes 61a-64b in the negative electrode layers 6 are arranged so as not to overlap each other as viewed in the stacking direction. This allows the portions of the piezoelectric layers 41 where the first to the fourth positive lead electrodes 51a-54b and the first to the fourth negative lead electrodes 61a-64b are provided to be piezoelectrically inactive, thus the occurrence of undesirable vibration can be prevented or reduced in the actuator body 4. This achieves well-balanced vibration of the actuator body 4, and thus the vibration efficiency can be improved.

In addition, the alternating arrangement of the positive and the negative electrode layers 5 and 6 allows the actuator body 4 to vibrate uniformly in the stacking direction. In this regard, if the positive and the negative electrode layers 5 and 6 are randomly stacked, the strength of applied electric field will vary for each of the piezoelectric layers 41, thereby causing the actuator body 4 to vibrate non-uniformly in the stacking direction. On the contrary, the alternating arrangement of the positive and the negative electrode layers 5 and 6 causes each of the piezoelectric layers 41 to be surely interposed between a pair of the positive and the negative electrode layers 5 and 6, and thus the strength of applied electric field can be generally the same for each of the piezoelectric layers 41 (although the orientation of electric field varies depending on the arrangement of the positive and the negative electrode layers 5 and 6). This allows the actuator body 4 to vibrate uniformly in the stacking direction. Accordingly, excessive vibration is prevented from occurring in the piezoelectric layers 41, and thus the energy loss is significantly reduced, thereby allowing the supplied electric power to be efficiently converted to vibration.

In this embodiment, the positive and the negative diagonal-connection electrodes 55A and 65A are arranged to be out of alignment so as not to overlap each other as viewed in the stacking direction, and thus the electric field does not act along the polarization direction in the portions of the piezoelectric layers 41 where the positive and the negative diagonal-connection electrodes 55A and 65A are provided. Instead, in these portions of the piezoelectric layers 41, the electric field acts along a direction of a line connecting the positive and the negative diagonal-connection electrodes 55A and 65A, which is an oblique direction relative to the polarization direction. That is, these portions of the piezoelectric layers 41 produce vibration even though slightly. In this regard, since the alternating arrangement of the positive and the negative electrode layers 5 and 6 causes the positive and the negative diagonal-connection electrodes 55A and 65A to be also alternately provided as described above, thereby allowing the portions of the piezoelectric layers 41 where the positive and the negative diagonal-connection electrodes 55A and 65A are provided to vibrate also uniformly in the stacking direction.

By providing a same number of the positive and the negative electrode layers 5 and 6, the symmetry of vibration of the actuator body 4 can be improved. This prevents or reduces undesired vibration in the actuator body 4, and thus the energy loss is significantly reduced, thereby allowing the supplied electric power to be efficiently converted to vibration.

An arrangement such that the outermost layers of the actuator body 4 in the stacking direction are piezoelectric layers 41 improves the reliability of the ultrasonic actuator 2. Specifically, when a small-sized ultrasonic actuator 2 (e.g., of approximately 1-20 mm in length) is mounted in a very small space in an electronic device, and if an outermost layer of the actuator body 4 is either the positive or the negative electrode layer 5 or 6, contact of a metal part in the vicinity with a principal surface of the actuator body 4 may cause short circuit in the positive or the negative electrode layer 5 or 6 in the outermost layer, thereby causing the characteristics of the ultrasonic actuator 2 to be significantly reduced. In this regard, as described above, since the outermost layers of the actuator body 4 in the stacking direction are piezoelectric layers 41, which are insulators, no short circuits occur even if a metal part contacts a principal surface of the actuator body 4. This improves the reliability of the ultrasonic actuator 2.

Greater thicknesses of the piezoelectric layers 41 having the positive and the negative external-connection electrodes 75B+ and 75B− than the other piezoelectric layers 41 prevents or reduces the occurrence of undesired vibration due to electric fields generated between both the positive and the negative external-connection electrodes 75B+ and 75B− and either the positive or the negative electrode layer 5 or 6. Specifically, in each piezoelectric layer 41 having the positive and the negative external-connection electrodes 75B+ and 75B−, the principal surface 41a (41b) opposite the principal surface 41b (41a) having the positive and the negative external-connection electrodes 75B+ and 75B− is provided with either the positive or the negative electrode layer 5 or 6. Therefore, in this piezoelectric layer 41, electric fields may be generated between either the positive or the negative external-connection electrode 75B+ or 75B− and either the positive or the negative electrode layer 5 or 6. In this regard, increase of the thicknesses of the piezoelectric layers 41 having the positive and the negative external-connection electrodes 75B+ and 75B− prevents or reduces the occurrence of undesired vibration in the piezoelectric layer 41 due to electric fields generated between either the positive or the negative external-connection electrode 75B+ or 75B− and either the positive or the negative electrode layer 5 or 6.

Without creating any overlaps in the both end portions in the longitudinal direction of each piezoelectric layer 41 between the split electrodes 51A-54B of the positive electrode layer 5 and the split electrodes 61A-64B of the negative electrode layer 6, the supplied electric power can be efficiently converted to vibration. Specifically, the both end portions in the longitudinal direction of each piezoelectric layer 41 are sufficiently far apart from the stress concentration portion of the first-order mode of stretching vibration (i.e., the central portion in the longitudinal direction of each piezoelectric layer 41), and thus stress is unlikely to be generated. If any electrodes are formed in the portions where stress is unlikely to be generated, the power supplied through the electrode is not efficiently converted to vibration, and thus an electrical loss occurs easily. Accordingly, in order to efficiently convert the supplied power to vibration, it is preferable that the electrodes be not formed in either of the end portions in the longitudinal direction of each piezoelectric layer 41, where stress is unlikely to be generated, as described above, but be formed in the other portions: the stress concentration portion of stretching vibration and the vicinity thereof. Specifically, it is preferable that electrodes be not formed in regions from the respective ends in the longitudinal direction of each piezoelectric layer 41 to respective locations a distance corresponding to 10% of the length in the longitudinal direction of the piezoelectric layer 41 inward in the longitudinal direction from the respective ends; that the overlapped portions of the positive and the negative electrode layers 5 and 6 be each formed in a region inward in the longitudinal direction from the respective locations the distance corresponding to 10% of the length inward from the respective ends; and that the electrodes be each formed in a region inward in the longitudinal direction from a location the distance corresponding to 20% of the length in the longitudinal direction of the piezoelectric layer 41 inward from the each end. This allows the first-order mode of stretching vibration to be efficiently induced, and the efficiency of the ultrasonic actuator 2 to be improved.

In addition, without creating any overlaps in the central portion in the lateral direction of each piezoelectric layer 41 between the split electrodes 51A-54B of the positive electrode layer 5 and the split electrodes 61A-64B of the negative electrode layer 6, the supplied electric power can be efficiently converted to vibration. Specifically, the central portion in the lateral direction of each piezoelectric layer 41 is sufficiently far apart from the stress concentration portions of the second-order of bending vibration (i.e., the both end portions in the lateral direction of each piezoelectric layer 41), and thus stress is unlikely to be generated. If any electrodes are formed in the portions where stress is unlikely to be generated, the power supplied through the electrode is not efficiently converted to vibration, and thus an electrical loss occurs easily. Accordingly, in order to efficiently convert the supplied power to vibration, it is preferable that the electrodes be not formed in the central portion in the lateral direction of each piezoelectric layer 41, where stress is unlikely to be generated, as described above, but be formed in the other portions: the stress concentration portions of bending vibration and the vicinities thereof. Specifically, it is preferable that electrodes be not formed in regions from the center in the lateral direction of each piezoelectric layer 41 to respective locations a distance corresponding to 10% of the length in the lateral direction of the piezoelectric layer 41 outward in the lateral direction from the center, but be formed in regions outward in the lateral direction from the respective locations the distance corresponding to 10% of the length outward. This allows the second-order of bending vibration to be efficiently induced, and the efficiency of the ultrasonic actuator 2 to be improved.

Second Embodiment

Figure 9:
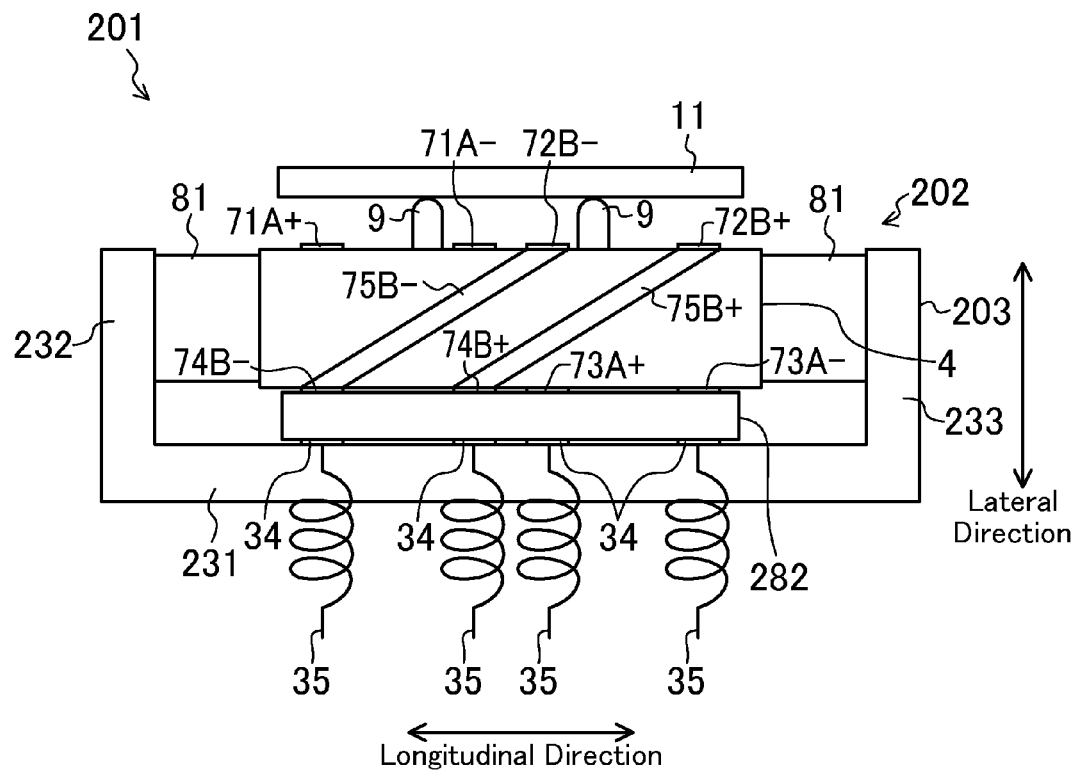
FIG. 9 is a front view of a drive unit according to the second embodiment.

A drive unit 201 according to the second embodiment of the present invention will be described below with reference to FIG. 9. FIG. 9 is a front view illustrating a schematic configuration of a drive unit according to the second embodiment.

An ultrasonic actuator 202 is different from the ultrasonic actuator 2 according to the first embodiment in a method of supplying power to the actuator 4. Thus, like reference characters indicate the components similar to those of the first embodiment, and the explanation thereof will be omitted. The description below will focus on unique aspects.

In detail, a rubber biasing member 282 for biasing the actuator body 4 toward the stage 11 is formed of conductive rubber. The rubber biasing member 282 is, for example, a conductive rubber block having a stacked configuration of support layers made primarily of silicone rubber and conductive layers in which metal particles, such as silver particles, are mixed into silicone rubber. The rubber biasing member 282 is electrically insulated in the stacking direction thereof, and is anisotropic.

The rubber biasing member 282 configured as described above is disposed between the longer side surface, of the actuator body 4, which is not provided with the driver elements 9, and a long-side wall portion 231 of a case 203. Counter electrodes 34 are provided in a region facing the longer side surface of the actuator body 4, on the inner peripheral surface of the long-side wall portion 231 of the case 203. The counter electrodes 34 are provided at respective locations opposed to the fourth negative and positive side-connection electrodes 74B– and 74B+ and the third positive and negative side-connection electrodes 73A+ and 73A– of the actuator body 4. The counter electrodes 34 are electrically insulated from each other. The counter electrodes 34 are connected to the control unit 10 through wires 35, and are supplied with AC voltages from the control unit 10. The rubber biasing member 282 is disposed such that the stacking direction thereof is aligned with the longitudinal direction of the actuator body 4. Specifically, the rubber biasing member 282 conducts current between the fourth negative and positive side-connection electrodes 74B– and 74B+ and the third positive and negative side-connection electrodes 73A+ and 73A– provided on the longer side surface of the actuator body 4; and the counter electrodes 34 of the case 203, respectively. Since the stacking direction of the rubber biasing member 282 is aligned with the longitudinal direction of the actuator body 4, the side-connection electrodes 73A+ through 74B– of the actuator body 4 do not have electrical continuity with one another through the rubber biasing member 282.

While this embodiment achieves the supply of power to the side-connection electrodes 73A+ through 74B– of the actuator body 4 by the conductive rubber block, the present invention is not limited thereto. For example, a flexible printed board may be adhered to the side-connection electrodes 73A+ through 74B– of the actuator body 4 through an anisotropic conductive film. Alternatively, wires may be connected to the side-connection electrodes 73A+ through 74B– of the actuator body 4 through a conductive adhesive agent. Note that the arrangement of power supply means for the actuator body 4 is preferably symmetric about a line extending along a thickness direction passing through the center in the longitudinal direction of the actuator body 4. That is, whether the power supply means is the rubber biasing member 282 or something else such as an anisotropic conductive film or a conductive adhesive agent, the power supply means disturbs the vibration of the actuator body 4 to some extent as long as the power supply means contacts with the actuator body 4. Therefore, as described above, a symmetrical arrangement of the power supply means in the longitudinal direction of the actuator body 4 allows the symmetry of the vibration of the actuator body 4 to be maintained.

Third Embodiment

An ultrasonic actuator 302 according to the third embodiment will be described below with reference to FIGS. 10 and 11A-11D. FIG. 10 is a front view illustrating a schematic configuration of an ultrasonic actuator according to the third embodiment. FIGS. 11A-11D are diagrams illustrating a configuration of an actuator body; FIG. 11A is a perspective view of the actuator body, and FIGS. 11B-11D are plan views of respective piezoelectric layers having electrode layers provided on principal surfaces, as viewed from one side of the stacking direction.

The ultrasonic actuator 302 is different from that of the first embodiment in that the side-connection electrodes are provided on the shorter side surfaces of the actuator body. Thus, like reference characters indicate the components similar to those of the first embodiment, and the explanation thereof will be omitted. The description below will focus on unique aspects.

The actuator body 304 includes a plurality of piezoelectric layers 41 and alternately stacked positive and negative electrode layers 305 and 306, interposing the respective piezoelectric layers 41 therebetween.

Similarly to the first embodiment, the positive electrode layers 305 each includes four positive split electrodes 51A, 52B, 53A, and 54B (hereinafter also denoted as 51A-54B), and a positive diagonal-connection electrode 55A for connecting together the first and the third positive split electrodes 51A and 53A. The positive split electrodes respectively include positive lead electrodes, whose configurations are different from those of the first embodiment. In detail, the first positive split electrode 51A has no positive lead electrode.

The second positive split electrode 52B has a second positive lead electrode 352b, which extends from an outer portion in the longitudinal direction to both the adjacent shorter side surface and longer side surface of the piezoelectric layer 41. The third positive split electrode 53A has a third positive lead electrode 353a, which extends from an outer portion in the longitudinal direction to the adjacent shorter side surface of the piezoelectric layer 41. The fourth positive split electrode 54B has a fourth positive lead electrode 354b, which extends from an inward portion in the longitudinal direction to the adjacent longer side surface of the piezoelectric layer 41.

Similarly to the first embodiment, the negative electrode layers 306 also each includes four negative split electrodes 61A, 62B, 63A, and 64B (hereinafter also denoted as 61A-64B), and a negative diagonal-connection electrode 65A for connecting together the first and the third negative split electrodes 61A and 63A. The negative split electrodes respectively include negative lead electrodes, whose configurations are different from those of the first embodiment. In detail, the first negative split electrode 61A has a first negative lead electrode 361a, which extends from an outer portion in the longitudinal direction to the adjacent shorter side surface of the piezoelectric layer 41. The second negative split electrode 62B has a second negative lead electrode 362b, which extends from an inward portion in the longitudinal direction to the adjacent longer side surface of the piezoelectric layer 41. The third negative split electrode 63A has no negative lead electrode. The fourth negative split electrode 64B has a fourth negative lead electrode 364b, which extends from an outer portion in the longitudinal direction to both the adjacent shorter side surface and longer side surface of the piezoelectric layer 41.

Side-connection electrodes 371A- through 374B- for connecting together the split electrodes formed on different piezoelectric layers 41 are formed on the longer and the shorter side surfaces of the piezoelectric layers 41.

Specifically, a second positive side-connection electrode 372B+, which is connected to the second positive lead electrodes 352b of the second positive split electrodes 52B, is formed in the corner of the longer and the shorter side surfaces of a piezoelectric layer 41 corresponding to the region A2 (i.e., a portion from one end portion in the longitudinal direction (referred to hereinafter as "longitudinal direction of the piezoelectric layer 41") of one longer side surface of the piezoelectric layer 41 to one end portion in the lateral direction (referred to hereinafter as "lateral direction of the piezoelectric layer 41") of one shorter side surface of the piezoelectric layer 41). A third positive side-connection electrode 373A+, which is connected to the third positive lead electrodes 353a of the third positive split electrodes 53A, is formed in the end portion of the one shorter side surface of the piezoelectric layer 41, opposite the second positive side-connection electrode 372B+. A fourth positive side-connection electrode 374B+, which is connected to the fourth positive lead electrodes 354b of the fourth positive split electrodes 54B, is formed at a relatively central location in the longitudinal direction of the other longer side surface (the longer side surface on which the second positive side-connection electrode 372B+ is not formed) of the piezoelectric layer 41. A fourth negative side-connection electrode 374B-, which is connected to the fourth negative lead electrodes 364b of the fourth negative split electrodes 64B, is formed in the corner of the longer and the shorter side surfaces of the piezoelectric layer 41 corresponding to the region A4 (i.e., a portion from the other end portion in the longitudinal direction of the other longer side surface of the piezoelectric layer 41 to the other end portion in the lateral direction of the other shorter side surface of the piezoelectric layer 41). A first negative side-connection electrode 371A-, which is connected to the first negative lead electrodes 361a of the first negative split electrodes 61A, is formed in the end portion of the other shorter side surface of the piezoelectric layer 41, opposite the fourth negative side-connection electrode 374B-. A second negative side-connection electrode 372B-, which is connected to the second negative lead electrodes 362b of the second negative split electrodes 62B, is formed at a relatively central location in the longitudinal direction of the one longer side surface (the longer side surface on which the second positive side-connection electrode 372B+ is formed) of the piezoelectric layer 41.

Thus, the first to the fourth positive split electrodes 51A-54B formed on different piezoelectric layers 41 respectively have electrical continuity with one another through the second to the fourth positive side-connection electrodes 372B+ through 374B+, while the first to the fourth negative split electrodes 61A-64B formed on different piezoelectric layers 41 respectively have electrical continuity with one another through the first, second, and fourth negative side-connection electrodes 371A-, 372B-, and 374B-.

Here, the first positive split electrodes 51A are not provided with lead electrodes. However, the first positive split electrodes 51A have electrical continuity with the third positive split electrodes 53A through the positive diagonal-connection electrodes 55A. Thus, a first positive split electrode 51A has electrical continuity also with the third positive split electrodes 53A and the first positive split electrodes 51A formed on the other piezoelectric layers 41 through the third positive lead electrodes 353a connected to the third positive split electrodes 53A and the third positive side-connection electrodes 373A+. That is, the first and the third positive split electrodes 51A and 53A formed on different piezoelectric layers 41 conduct.

Similarly, the third negative split electrodes 63A are not provided with lead electrodes. However, the third negative split electrodes 63A have electrical continuity with the first negative split electrodes 61A through the negative diagonal-connection electrodes 65A. Thus, a third negative split electrode 63A has electrical continuity also with the first negative split electrodes 61A and the third negative split electrodes 63A formed on the other piezoelectric layers 41 through the first negative lead electrodes 361a connected to the first negative split electrodes 61A and the first negative side-connection electrodes 371A-. That is, the first and the third negative split electrodes 61A and 63A formed on different piezoelectric layers 41 conduct.

Meanwhile, a second and a fourth positive split electrodes 52B and 54B do not conduct within a positive electrode layer 305. Similarly, a second and a fourth negative split electrodes 62B and 64B do not conduct within a negative electrode layer 306.

Consequently, a positive external-connection electrode 375B+ is provided for connecting together the second positive side-connection electrode 372B+ connected to the second positive split electrodes 52B and the fourth positive side-connection electrode 374B+ connected to the fourth positive split electrodes 54B. In addition, a negative external-connection electrode 375B- is provided for connecting together the second negative side-connection electrode 372B- connected to the second negative split electrodes 62B and the fourth negative side-connection electrode 374B- connected to the fourth negative split electrodes 64B. A positive and a negative external-connection electrodes 375B+ and 375B- are provided on each of the principal surfaces 41a and 41b having neither positive electrode layer 305 nor negative electrode layer 306 thereon (i.e., each of the outward principal surfaces of the outermost piezoelectric layers 41 among the stacked piezoelectric layers 41), of the principal surfaces 41a and 41b of the piezoelectric layers 41. The positive and the negative external-connection electrodes 375B+ and 375B− extend in parallel with each other on the outer principal surfaces 41a or 41b of each of the outermost piezoelectric layers 41. The positive and negative external-connection electrodes 375B+ and 375B− are formed on the corresponding principal surfaces 41a or 41b of the corresponding piezoelectric layers 41 using a technique such as baking, thermal spraying, and sputtering of metal such as gold, silver, and palladium.

This causes a second positive split electrode 52B and a fourth positive split electrode 54B to conduct through the positive external-connection electrodes 375B+; therefore, the second positive split electrodes 52B and the fourth positive split electrodes 54B formed on different piezoelectric layers 41 conduct. Similarly, since a second negative split electrode 62B and a fourth negative split electrode 64B conduct through the negative external-connection electrodes 375B−, the second negative split electrodes 62B and the fourth negative split electrodes 64B formed on different piezoelectric layers 41 conduct.

Although the positive external-connection electrodes 375B+ is connected to the portion on the longer side surface of the second positive side-connection electrode 372B+ in this embodiment, the positive external-connection electrodes 375B+ may be connected to the portion on the shorter side surface. Similarly, although the negative external-connection electrodes 375B− is connected to the portion on the longer side surface of the fourth negative side-connection electrode 374B− in this embodiment, the negative external-connection electrodes 375B− may be connected to the portion on the shorter side surface.

In the actuator body 304 configured as described above, two side-connection electrodes are exposed on each of the shorter side surfaces. Supplying power to these side-connection electrodes exposed on the shorter side surfaces allows power to be supplied to the first to the fourth positive split electrodes 51A-54B and the first to the fourth negative split electrodes 61A-64B.

In detail, as shown in FIG. 10, while the actuator body 304 is housed in a case 303, rubber supports 381 are respectively provided between the shorter side surfaces of the actuator body 304 and a first and a second short-side wall portions 332 and 333 of the case 303. The rubber supports 381 are formed of, for example, conductive rubber blocks each having a stacked configuration of support layers made primarily of silicone rubber and conductive layers in which metal particles, such as silver particles, are mixed into silicone rubber. The rubber supports 381 are electrically insulated in the stacking direction thereof, and are anisotropic. The rubber supports 381 are disposed such that the stacking direction thereof is aligned with the lateral direction of the actuator body 304. Counter electrodes 334 are provided at respective locations opposed to the first and the fourth negative side-connection electrodes 371A− and 374B− on the corresponding shorter side surface of the actuator body 304, on the inner peripheral surface of the first short-side wall portion 332 of the case 303. In addition, other counter electrodes 334 are provided at respective locations opposed to the second and the third positive side-connection electrodes 372B+ and 373A+ on the corresponding shorter side surface of the actuator body 304, on the inner peripheral surface of the second short-side wall portion 333. The counter electrodes 334 are electrically insulated from each other. The counter electrodes 334 are connected to the control unit 10 through wires 335, and are supplied with AC voltages from the control unit 10. Applying AC voltages individually to the four side-connection electrodes 372B+, 373A+, 371A−, and 374B− exposed on the shorter side surfaces of the actuator body 304 allows AC voltages to be applied individually to the pair of the first and the third positive split electrodes 51A and 53A, the pair of the second and the fourth positive split electrodes 52B and 54B, the pair of the first and the third negative split electrodes 61A and 63A, and the pair of the second and the fourth negative split electrodes 62B and 64B.

Thus, according to the ultrasonic actuator 302 of the third embodiment, the usage of the rubber supports 381 for conducting electricity between the actuator body 304 and the case 303, and the usage of the rubber biasing member 82 for biasing the actuator body 304 toward the stage 11 allows the rubber supports 381 and the rubber biasing member 82 to be used in respectively appropriate compression conditions. Specifically, an appropriate compression condition of the rubber supports 381 for stable conduction and a compression condition of the rubber biasing member 82 for providing suitable biasing force may be different. For example, in the ultrasonic actuator 202 of the second embodiment, the rubber biasing member 282 provides both the function for conducting electricity between the actuator body 4 and the case 203, and the function for biasing the actuator body 4 toward the stage 11. This causes the compression condition of the rubber biasing member 282 to be either one of the appropriate compression condition for stable conduction and the compression condition for providing suitable biasing force, or the balanced compression condition between the both compression conditions. That is, it is difficult to achieve an appropriate conduction condition and suitable biasing force at the same time in the second embodiment. On the contrary, according to the ultrasonic actuator 302 of this embodiment, since the compression condition of the rubber supports 381 and the compression condition of the rubber biasing member 82 can be individually specified, stable conduction between the actuator body 304 and the case 303 and suitable biasing of the actuator body 304 toward the stage 11 can be achieved at the same time.

Furthermore, the actuator body 304 may be configured such that at least one of the side-connection electrodes, of the two side-connection electrodes provided on each of the shorter side surfaces, is formed not only on the shorter side surface but also onto the corresponding longer side surface. This allows a sufficient insulation distance to be secured between the two side-connection electrodes formed on one shorter side surface. That is, for reliable connections between the lead electrodes extending from the split electrodes and the corresponding side-connection electrodes, it is preferable that the lead electrodes and the side-connection electrodes have relatively large widths. However, since the width of shorter side surfaces of the actuator body 304 is less than that of the longer side surface, a larger width of the side-connection electrodes etc. makes it difficult to secure a sufficient insulation distance between the two side-connection electrodes in the configuration in which two side-connection electrodes are disposed on each shorter side surface. By contrast, according to the actuator body 304, by configuring such that at least one of the side-connection electrodes is formed not only on the shorter side surface but also onto the corresponding longer side surface, the width of at least one side-connection electrode can be extended to the corresponding longer side surface, while a sufficient spacing can be secured with the adjacent side-connection electrode. Although the actuator body 304 has been described as being configured such that one of the two side-connection electrodes formed on each of the shorter side surfaces is formed also on the corresponding longer side surface, the present invention is not limited thereto; both of the side-connection electrodes may be formed onto the respective adjacent longer side surfaces.

Fourth Embodiment

Figure 13:
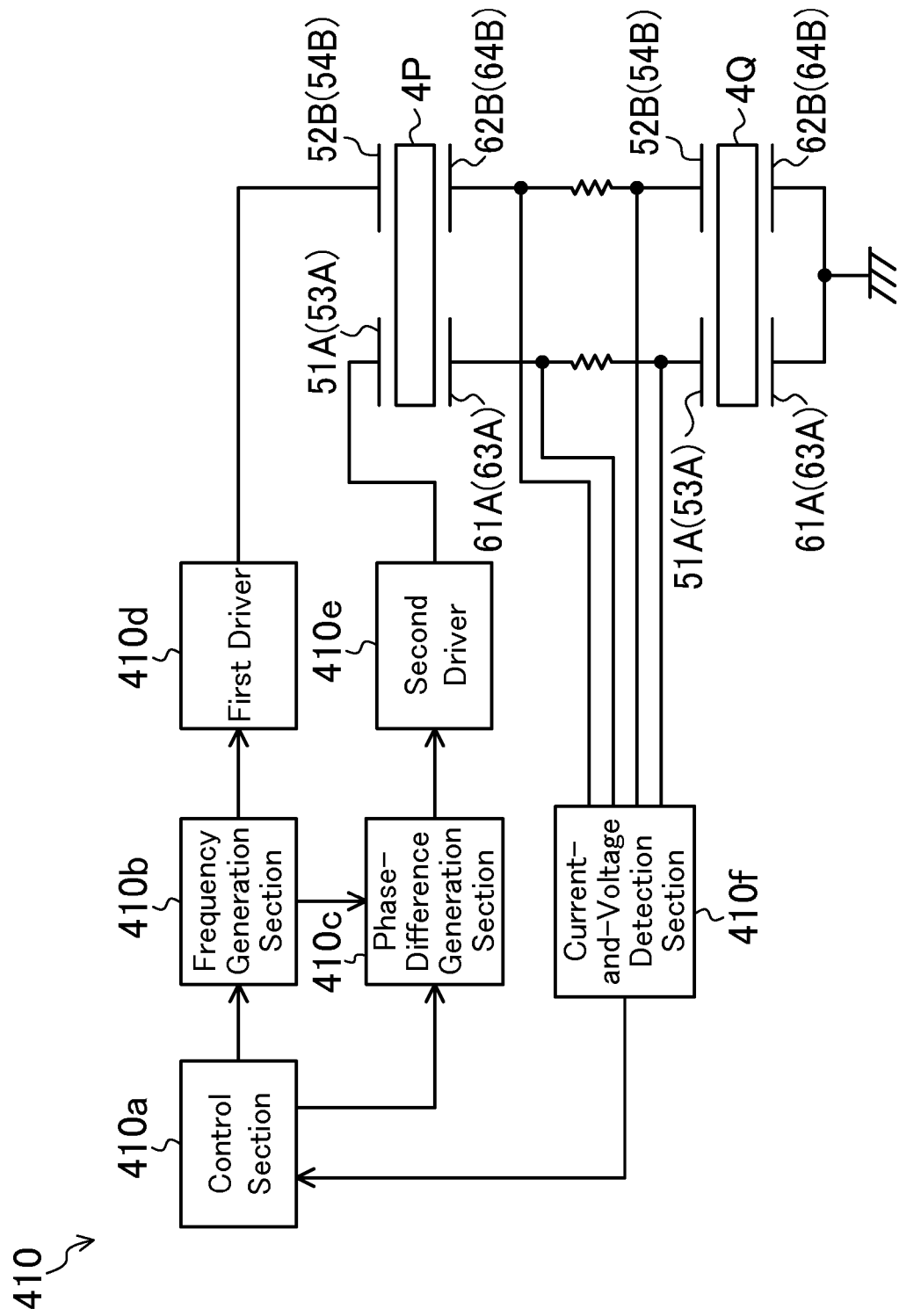
FIG. 13 is a block diagram of a control unit.

A drive unit 401 according to the fourth embodiment will be described below with reference to FIGS. 12 and 13. FIG. 12 is a perspective view of the drive unit 401, and FIG. 13 is a block diagram of the control unit 410.

The ultrasonic actuator 402 according to the fourth embodiment includes two actuator bodies: a first actuator body 4P and a second actuator body 4Q.

Each of the first and the second actuator bodies 4P and 4Q has a same or similar configuration to the actuator body 4 of the first embodiment. That is, although not shown, the first and the second actuator bodies 4P and 4Q are respectively housed in cases with rubber supports and rubber biasing members interposed therebetween. The first and the second actuator bodies 4P and 4Q are linearly arranged so that the longitudinal directions thereof are aligned with each other, and are placed so that the driver elements 9 contact with the stage 11. The first and the second actuator bodies 4P and 4Q are each biased from the longer side surface on which the driver elements 9 are not provided, and the driver elements 9 are pressed to the stage 11. This increases friction force between the driver elements 9 and the stage 11, and thus the vibration of the first and the second actuator bodies 4P and 4Q is more reliably transmitted to the stage 11 via the driver elements 9.

The first actuator body 4P and the second actuator body 4Q are electrically connected together in series. In detail, the first or the third negative side-connection electrode 71A− or 73A− having electrical continuity with the first and the third negative split electrodes 61A and 63A of a negative electrode layer 6 of the first actuator body 4P, and the first or the third positive side-connection electrode 71A+ or 73A+ having electrical continuity with the first and the third positive split electrodes 51A and 53A of a positive electrode layer 5 of the second actuator body 4Q are connected together; the second or the fourth negative side-connection electrode 72B− or 74B− having electrical continuity with the second and the fourth negative split electrodes 62B and 64B of a negative electrode layer 6 of the first actuator body 4P, and the second or the fourth positive side-connection electrode 72B+ or 74B+ having electrical continuity with the second and the fourth positive split electrodes 52B and 54B of a positive electrode layer 5 of the second actuator body 4Q are connected together. That is, a series connection is established in the following order: the control unit 410, the first and the third positive split electrodes 51A and 53A of the positive electrode layers 5 of the first actuator body 4P, the first and the third negative split electrodes 61A and 63A of the negative electrode layers 6 of the first actuator body 4P, the first and the third positive split electrodes 51A and 53A of the positive electrode layers 5 of the second actuator body 4Q, the first and the third negative split electrodes 61A and 63A of the negative electrode layers 6 of the second actuator body 4Q, and ground; and another series connection is established in the following order: the control unit 410, the second and the fourth positive split electrodes 52B and 54B of the positive electrode layers 5 of the first actuator body 4P, the second and the fourth negative split electrodes 62B and 64B of the negative electrode layers 6 of the first actuator body 4P, the second and the fourth positive split electrodes 52B and 54B of the positive electrode layers 5 of the second actuator body 4Q, the second and the fourth negative split electrodes 62B and 64B of the negative electrode layers 6 of the second actuator body 4Q, and ground.

The configuration of the control unit 410 will now be described.

The control unit 410 includes a control section 410a, a frequency generation section 410b, a phase-difference generation section 410c, a first driver 410d, a second driver 410e, and a current-and-voltage detection section 410f.

A sinusoidal voltage having a predetermined frequency generated in the frequency generation section 410b is applied to the first and the second actuator bodies 4P and 4Q, connected together in series, through the first driver 410d as a first AC voltage. The phase-difference generation section 410c shifts the phase of the sinusoidal voltage generated in the frequency generation section 410b, and the phase-shifted sinusoidal voltage is applied to the first and the second actuator bodies 4P and 4Q, connected together in series, through the second driver 410e as a second AC voltage having a same frequency as, and a different phase from, those of the first AC voltage. The current and the voltage between the first or the third negative side-connection electrode 71A− or 73A− of the first actuator body 4P, and the first or the third positive side-connection electrode 71A+ or 73A+ of the second actuator body 4Q, as well as the current and the voltage between the second or the fourth negative side-connection electrode 72B− or 74B− of the first actuator body 4P, and the second or the fourth positive side-connection electrode 72B+ or 74B+ of the second actuator body 4Q are each detected by the current-and-voltage detection section 410f; and the current and voltage information is input to the control section 410a. The control section 410a determines a frequency of the first and the second AC voltages and a phase difference between the first and the second AC voltages based on information such as the current and voltage information from the current-and-voltage detection section 410f. Then, the control section 410a outputs the frequency information to the frequency generation section 410b, and outputs the phase difference information to the phase-difference generation section 410c.

Figure 14:
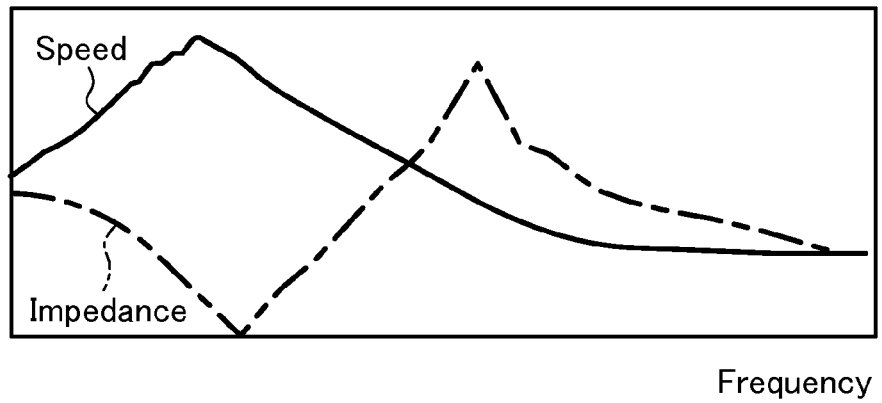
FIG. 14 shows a driving speed versus frequency characteristic of an ultrasonic actuator, and an impedance versus frequency characteristic of an actuator body.
Figure 15:
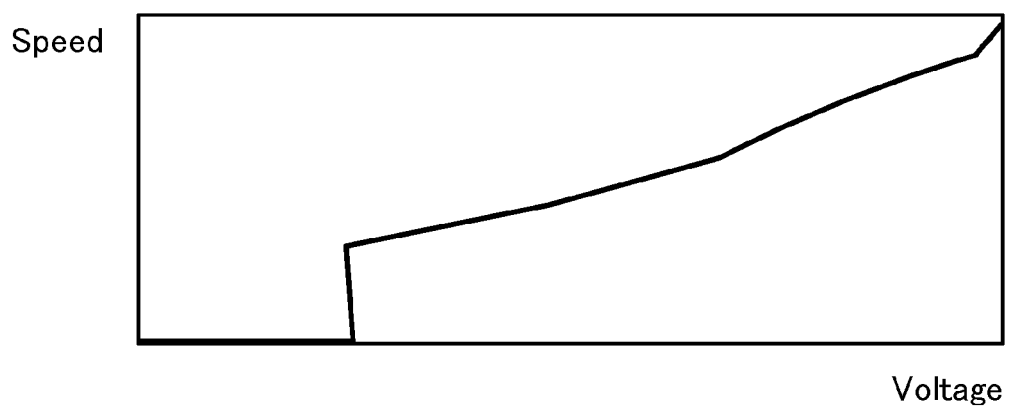
FIG. 15 shows a driving speed versus voltage characteristic of the ultrasonic actuator.
Figure 16:
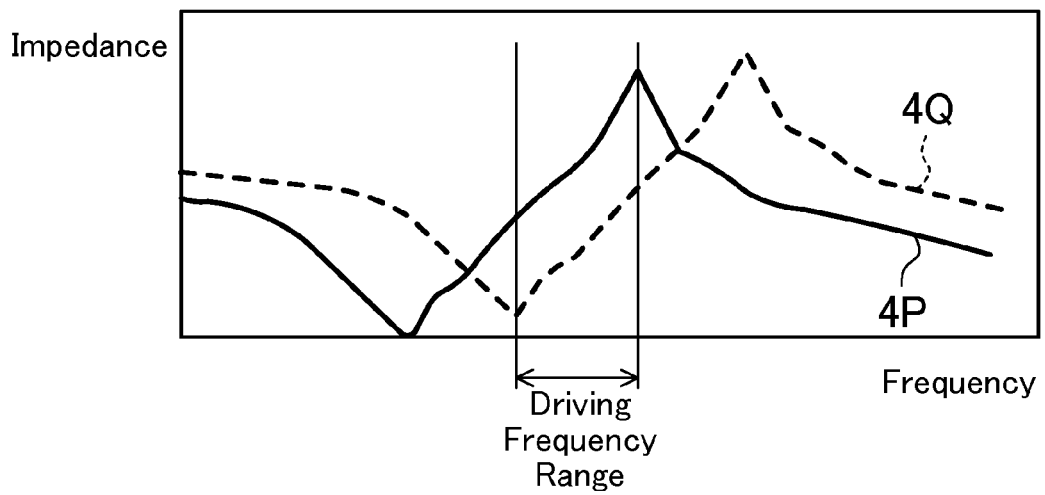
FIG. 16 shows impedance versus frequency characteristics of two actuator bodies having different resonance frequencies.
Figure 17:
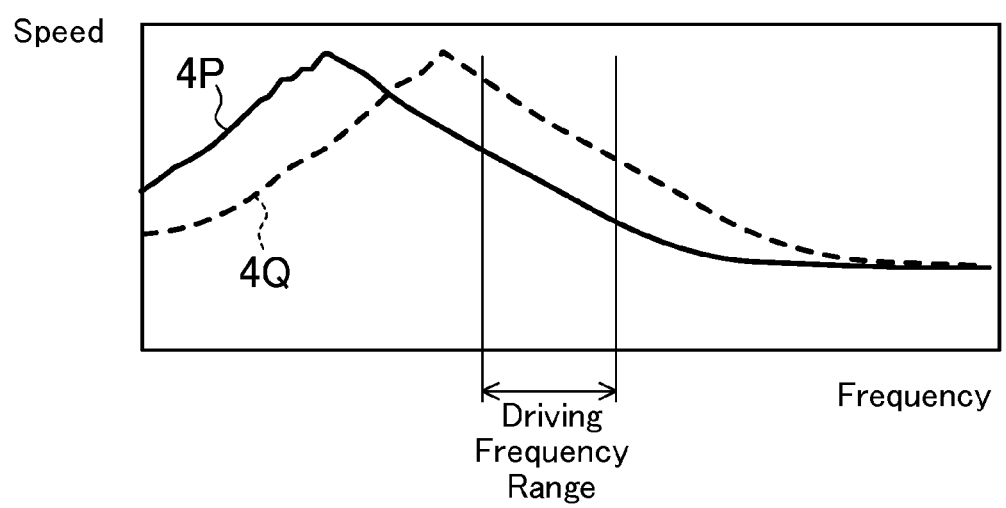
FIG. 17 shows driving speed versus frequency characteristics of two actuator bodies having different resonance frequencies.

The frequency characteristic and the voltage characteristic with respect to the driving speed of the ultrasonic actuator 402 (i.e., driving speed of the stage 11) will now be described. FIG. 14 shows a driving speed versus frequency characteristic of the ultrasonic actuator 402, and an impedance versus frequency characteristic of an actuator body. FIG. 15 shows a driving speed versus voltage characteristic of the ultrasonic actuator 402 for a two-phase AC voltage having a frequency of 270 kHz and a phase difference of 90°. FIG. 16 shows impedance versus frequency characteristics of two actuator bodies having different resonance frequencies. FIG. 17 shows driving speed versus frequency characteristics of two actuator bodies having different resonance frequencies.

The driving speed versus frequency characteristic of the ultrasonic actuator 402 has a convex shape with a peak at a resonance frequency (the frequency with the lowest impedance) of each actuator body 4P (or 4Q). The impedance versus frequency characteristic of the actuator body 4P (or 4Q) is the lowest in the vicinity of the maximum speed of the driving speed of the ultrasonic actuator 402, and increases as the frequency increases before ultimately reaching the peak. In this embodiment, from a viewpoint of efficiency, the moving speed of the stage 11 is controlled by changing the frequency within a frequency range higher than the resonance frequency. Regarding the driving speed versus voltage characteristic of the ultrasonic actuator 402, the stage 11 does not move while the supply voltage is below a predetermined value, and the stage 11 moves when the supply voltage exceeds the predetermined value; the moving speed increases monotonically with the supply voltage. That is, as higher voltages are applied to the actuator bodies 4P and 4Q, the stage 11 moves faster. However, if excessive voltages are applied to the actuator bodies 4P and 4Q, the displacement of the actuator bodies 4P and 4Q may become so large as to excess a fracture limit, or the current flowing through the actuator bodies 4P and 4Q may become so high as to generate excessive heat in the actuator bodies 4P and 4Q, and then to cause failure.

The absolute values of resonance frequencies of the actuator bodies 4P and 4Q depend largely on the external dimensions thereof. For example, if a piezoelectric element is to be manufactured so as to have a length of 6.0 mm, and the product has in fact a length of 0.10 mm different therefrom due to an error in the manufacturing process, the absolute value of resonance frequency shifts about 4.4 kHz from that of an element having a length of 6.0 mm. As shown in FIG. 16, if the resonance frequencies are different between the first and the second actuator bodies 4P and 4Q, frequencies corresponding to the peak moving speeds do not match as shown in FIG. 17. If such actuator bodies 4P and 4Q are placed into operation individually using a same frequency, the driving speeds will be different between the first and the second actuator bodies 4P and 4Q. In such a case, since both the actuator bodies 4P and 4Q contact the stage 11, one actuator body 4P (or 4Q) acts as a load on the other actuator body 4Q (or 4P), thereby disturbing the stage 11 from being driven efficiently by the two actuator bodies 4P and 4Q.

In this regard, one possible solution is to provide an individual power source for each of the first and the second actuator bodies 4P and 4Q, and to adjust the frequency of the voltage, the phase difference of the two-phase AC voltage, etc., for each of the first and the second actuator bodies 4P and 4Q. In such a configuration, while the mismatch in the driving speed versus frequency characteristic etc. will be small, the configuration and control of the power sources will be complex. Alternatively, although a parallel connection of the actuator bodies 4P and 4Q simplifies the configuration of the power sources, a mismatch will occur in the characteristics, and thus output power cannot be expected to increase proportionate to the number of actuator bodies.

Meanwhile, a series connection of the first and the second actuator bodies 4P and 4Q can reduce the difference between the driving speeds of the first and the second actuator bodies 4P and 4Q. Specifically, in a frequency range lower than the lower antiresonance frequency, of the antiresonance frequencies (the frequencies with the highest impedances) of the two actuator bodies, the actuator body having the higher impedance is driven more slowly in most cases. When the first and the second actuator bodies 4P and 4Q are connected together in series, a higher voltage is applied to the actuator body having a higher impedance. Therefore, in the frequency range described above, the actuator body driven more slowly is supplied with a relatively high voltage, while the actuator body driven faster is supplied with a relatively low voltage. Since a driving speed increases with a voltage as described above, the difference between the driving speeds of the two actuator bodies is reduced. As such, when the impedances are different between the first and the second actuator bodies 4P and 4Q, the difference between the driving speeds of the first and the second actuator bodies 4P and 4Q can be reduced.

Therefore, even when the first and the second actuator bodies 4P and 4Q have mismatched driving speed versus frequency characteristics and mismatched impedance versus frequency characteristics, and are operated with AC voltages having a same frequency, a series connection of the first and the second actuator bodies 4P and 4Q allows the difference between the driving speeds of the first and the second actuator bodies 4P and 4Q to be reduced. As described above, according to this embodiment, the first and the second actuator bodies 4P and 4Q can be stably operated in a cooperative manner using a common power source.

If the first and the second actuator bodies 4P and 4Q are connected together in series, the voltage is twice as high as when the voltage is individually applied to each actuator body 4. This is because the average impedance value becomes twice. Meanwhile, the current decreases by half as compared to when individually applied to each actuator body; thus, the power remains the same. As such, a series connection of the first and the second actuator bodies 4P and 4Q requires twice the voltage; thus, each actuator body 4 has a stacked configuration instead of a single plate configuration which requires a very high voltage.

Although the second actuator body 4Q is connected to ground in this embodiment, twice the voltage can be substantially applied if full-bridge driving is used.

It is preferable that the frequency of the first and the second AC voltages be adjusted within a frequency range which is higher than a resonance frequency of the actuator body having the higher resonance frequency among the first and the second actuator bodies 4P and 4Q, and lower than an antiresonance frequency of the actuator body having the lower antiresonance frequency among the first and the second actuator bodies 4P and 4Q (see FIG. 16). This is because, in this frequency range, the driving speeds decrease monotonically and the impedances increase monotonically as the frequency increases as shown in FIG. 17. Moreover, this frequency range can be found by detecting in advance the frequency characteristics of the first and the second actuator bodies 4P and 4Q. Note that the frequency range for adjusting the frequency of the first and the second AC voltages may be merely higher than a resonance frequency of the actuator body having the higher resonance frequency among the first and the second actuator bodies 4P and 4Q, or merely lower than an antiresonance frequency of the actuator body having the lower antiresonance frequency among the first and the second actuator bodies 4P and 4Q.

Furthermore, the first or the second actuator body 4P or 4Q may be operated with very low impedance if the resonance frequencies of the first and the second actuator bodies 4P and 4Q are significantly different from each other. Accordingly, the current and the voltage between the first and the second actuator bodies 4P and 4Q are monitored by the current-and-voltage detection section 410f, and the frequency of the first and the second AC voltages are changed if a detected value is abnormal (e.g., the voltage value is near the supply voltage or near the ground voltage). Note that one alternative is to monitor either the current or the voltage between the first and the second actuator bodies 4P and 4Q, and to change the frequency of the first and the second AC voltages if a detected value is abnormal.

Other Embodiments

The present invention may employ the following configurations with respect to the presented embodiments.

In the presented embodiments, the diagonal direction along which the first and the third positive split electrodes 51A and 53A, connected together by the positive diagonal-connection electrode 55A, are disposed in a positive electrode layer 5, and the diagonal direction along which the first and the third negative split electrodes 61A and 63A, connected together by the negative diagonal-connection electrode 65A, are disposed in a negative electrode layer 6 are the same; this is the diagonal direction D1. However, the diagonal direction along which the positive split electrodes connected together by the positive diagonal-connection electrode 55A, and the diagonal direction along which the negative split electrodes connected together by the negative diagonal-connection electrode 65A may be different. For example, the actuator body may be configured such that the first and the third positive split electrodes 51A and 53A, disposed along one diagonal direction D1, are connected together by the positive diagonal-connection electrode 55A in each of the positive electrode layers 5, while the second and the fourth negative split electrodes 62B and 64B, disposed along the other diagonal direction D2, are connected together by the negative diagonal-connection electrode 65A in each of the negative electrode layers 6. Moreover, the diagonal direction along which the positive split electrodes connected together by the positive diagonal-connection electrode 55A are disposed, and the diagonal direction along which the negative split electrodes connected together by the negative diagonal-connection electrode 65A are disposed may both be the diagonal direction D2.

While the presented embodiments have been described in which the positive and the negative diagonal-connection electrodes 55A and 65A are completely separated from each other so as not to overlap each other as viewed in the stacking direction, the present invention is not limited thereto. For example, the positive and the negative diagonal-connection electrodes 55A and 65A may be disposed so as to completely overlap each other as viewed in the stacking direction. However, from a viewpoint of reducing undesirable vibration, the positive and the negative diagonal-connection electrodes 55A and 65A are preferably out of alignment with each other to any degree, more preferably completely separated from each other so as not to overlap each other.

The positive electrode layers 5 and the negative electrode layers 6 may not be point-symmetric. Even if not point-symmetric, the number of patterns of screen printing plates is reduced to two, corresponding to the positive electrode layers 5 and the negative electrode layers 6; thus, the manufacturing cost can be reduced as compared with the conventional configuration requiring at least four patterns of screen printing plates.

The positive and the negative diagonal-connection electrodes 55A and 65A may be formed over most of the central portion in the longitudinal direction of the piezoelectric layers 41, other than the both end portions in the lateral direction. This increases the area of electrodes in the central portion in the longitudinal direction of each corresponding piezoelectric layer 41. The central portion in the longitudinal direction of each piezoelectric layer 41 corresponds to a node of the first-order mode of stretching vibration, that is, the stress concentration portion where stress due to stretching vibration concentrates. Most electric charges due to the piezoelectric effect are generated in this stress concentration portion. As described above, a larger area of electrode in this portion allows higher stretching vibration to be induced even if the size of the actuator body 4 is reduced; thus, the efficiency of the ultrasonic actuator 2 can be improved. In this regard, the positive and the negative diagonal-connection electrodes 55A and 65A are ideally formed over most of the width in the lateral direction of the piezoelectric layers 41. However, if the positive and the negative diagonal-connection electrodes 55A and 65A are formed to the both end portions in the lateral direction of the piezoelectric layers 41, then it is difficult to provide electrical insulation between the positive and the negative electrode layers 5 and 6. Accordingly, it is preferable that the positive and the negative diagonal-connection electrodes 55A and 65A be each formed in a region other than the both end portions in the lateral direction of the corresponding piezoelectric layer 41. Specifically, it is preferable that the positive and the negative diagonal-connection electrodes 55A and 65A be each formed in a region inward in the lateral direction each from a location a distance corresponding to the thickness of piezoelectric layer 41 inward in the lateral direction from each end in the lateral direction of the piezoelectric layer 41.

Note that, although larger electrode areas of the positive and the negative diagonal-connection electrodes 55A and 65A cause higher stretching vibration to be induced, excessively large electrode areas disturb the second-order mode of bending vibration. Thus, it is preferable that the width (in the longitudinal direction of the piezoelectric layers 41) of the positive and the negative diagonal-connection electrodes 55A and 65A be about 5-40% of the length in the longitudinal direction of the piezoelectric layers 41.

While the split electrodes 51A-64B have been described as electrodes having generally rectangular shapes, the present invention is not limited to this configuration; for example, the split electrodes 51A-64B may have any shapes depending on a distribution of stress generated by vibration.

Power supplying to the actuator body 4 may be performed by, instead of using wires, using other power supplying method, such as power supplying with a flexible substrate or power supplying with contact pins. These methods may also provide similar advantages to the presented embodiments.

Figure 18:
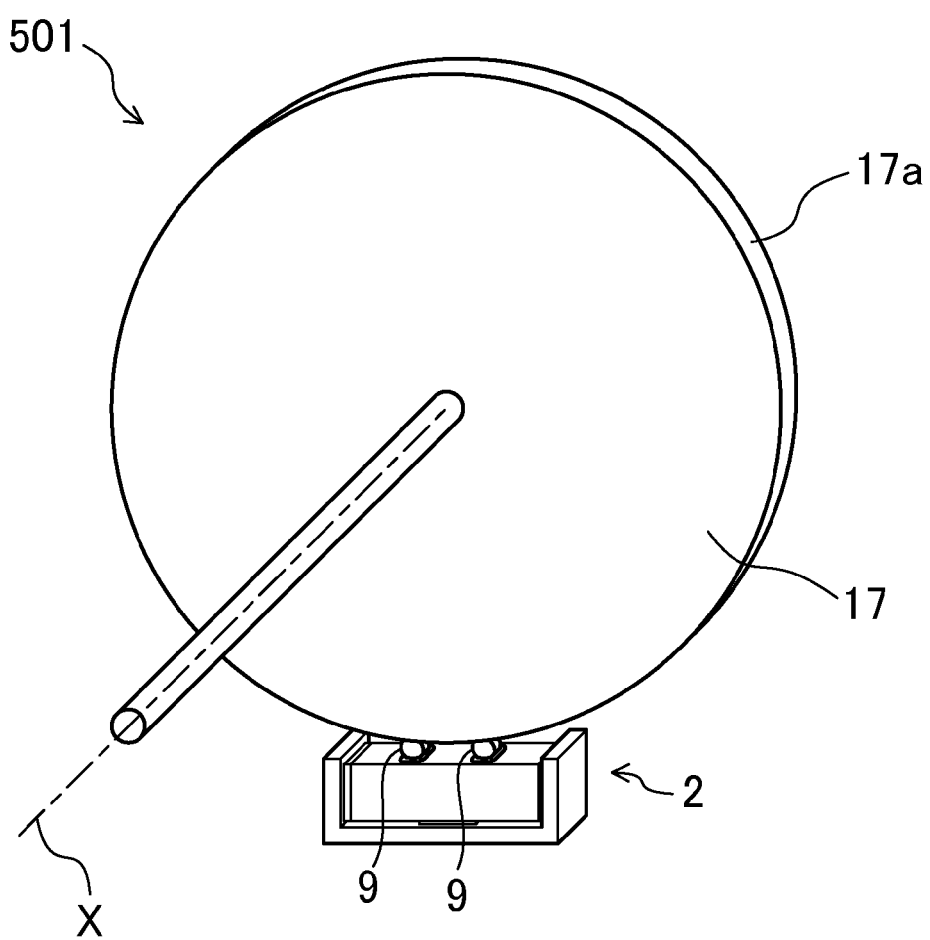
FIG. 18 is a perspective view of a drive unit according to another embodiment.
Figure 19:
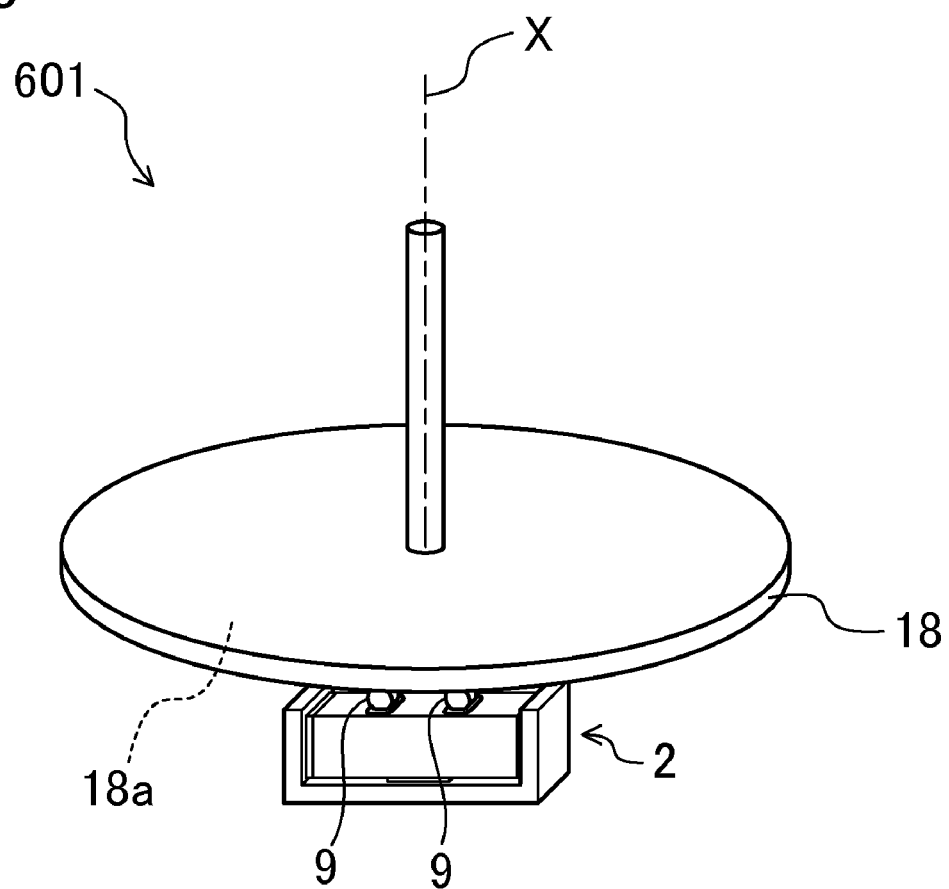
FIG. 19 is a perspective view of a drive unit according to a still another embodiment.
Figure 20A:
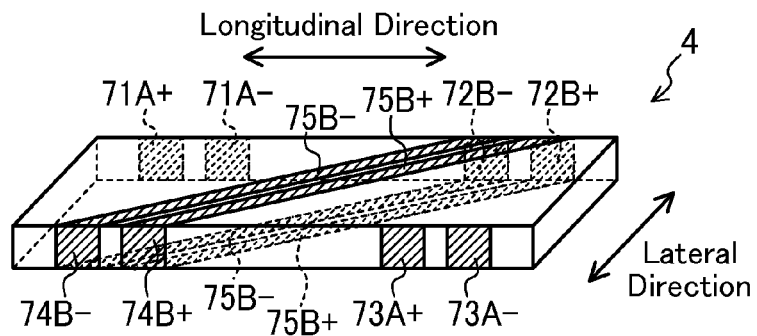
FIGS. 20A-20E are diagrams illustrating a configuration of an actuator body according to a yet another embodiment.
Figure 20B:
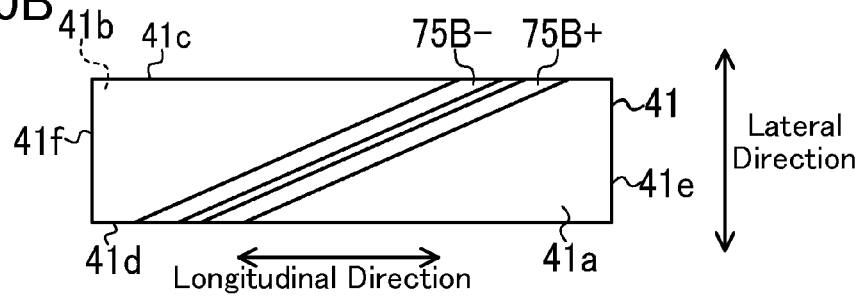
Figure 20C:
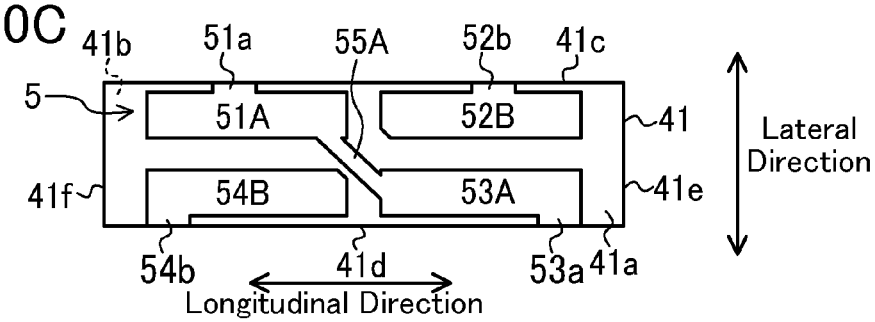
Figure 20D:
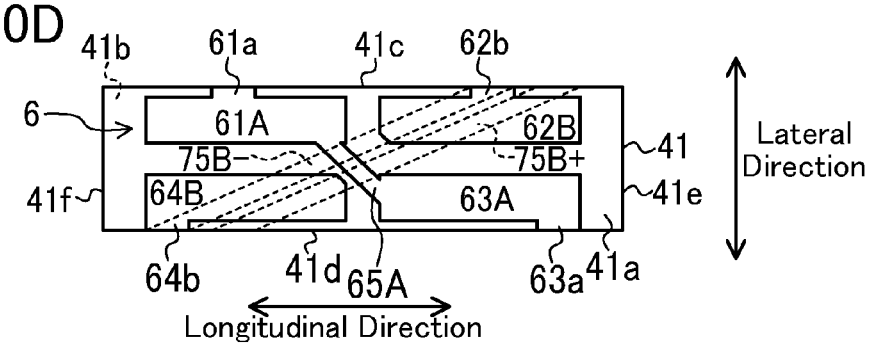
Figure 20E:
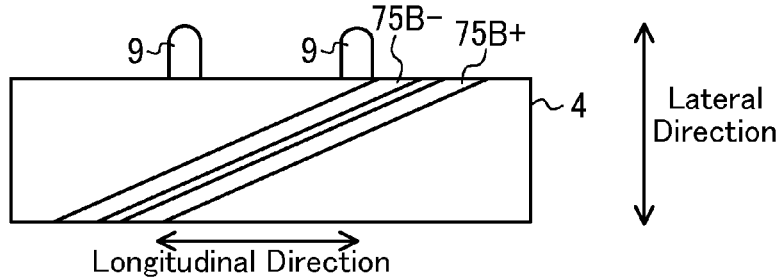

While the presented embodiments have been described in which the stage 11 serves as the movable body which is provided with driving force of the ultrasonic actuator 2 and is driven accordingly, the present invention is not limited to this configuration, but any configuration may be used as a configuration of the movable body. For example, as shown in FIG. 18, a drive unit 501 may be used, in which the movable body is a disk-shaped body 17 rotatable about a predetermined axis X, and the driver elements 9 of the ultrasonic actuator are configured to contact a circumferential surface 17a of the disk-shaped body 17. In such a configuration, when the ultrasonic actuator is driven, generally elliptical movement of the driver elements 9 causes the disk-shaped body 17 to rotate about the predetermined axis X. Alternatively, as shown in FIG. 19, a drive unit 601 may be used, in which the movable body is a disk-shaped body 18 rotatable about a predetermined axis X, and the driver elements 9 of the ultrasonic actuator are configured to contact a planar portion 18a of the disk-shaped body 18. In such a configuration, when the ultrasonic actuator is driven, generally elliptical movement of the driver elements 9 causes the disk-shaped body 18 to be driven in a tangential direction at locations where the driver elements 9 contact the disk-shaped body 18, thereby causes the disk-shaped body 18 to rotate about the predetermined axis X.

While the first through fourth embodiments have been described in terms of a configuration in which the driver elements 9 are provided on a longer side surface of the actuator body 4, the driver elements 9 may be provided on a shorter side surface of the actuator body 4. In such a case, the expanding/contracting direction of the first-order mode of stretching vibration is the direction in which the driver elements 9 intersect the stage 11 at right angles, and the vibratory direction of the second-order mode of bending vibration is the direction in which the stage 11 moves.

The phase difference between the first and the second AC voltages is not limited to 90°. Control of this phase difference allows the speed of stage 11 to be controlled.

While the presented embodiments have been described in which the first and the second positive side-connection electrodes 71A+ and 72B+ and the third and the fourth negative side-connection electrodes 73A− and 74B− are disposed at relatively outward locations in the longitudinal direction with respect to the driver elements 9, and in which the first and the second negative side-connection electrodes 71A− and 72B− and the third and the fourth positive side-connection electrodes 73A+ and 74B+ are disposed at relatively inward locations in the longitudinal direction with respect to the driver elements 9, the present invention is not limited to this configuration. For example, as shown in FIG. 20, the first and the second negative side-connection electrodes 71A− and 72B− and the third and the fourth positive side-connection electrodes 73A+ and 74B+ may also be disposed at relatively outward locations in the longitudinal direction with respect to the driver elements 9. On the contrary, all the side-connection electrodes may be disposed at relatively inward locations in the longitudinal direction with respect to the driver elements 9.

The presented embodiments have been described in which the actuator body 4 includes a first positive side-connection electrode 71A+ for connecting together the first positive split electrodes 51A provided on different piezoelectric layers 41, and a third positive side-connection electrode 73A+ for connecting together the third positive split electrodes 53A provided on different piezoelectric layers 41. However, providing only one of the side-connection electrodes may be sufficient. This is because the first positive split electrodes 51A and the third positive split electrodes 53A are connected together by the positive diagonal-connection electrodes 55A, and thus if either the first positive split electrodes 51A or the third positive split electrodes 53A is provided with side-connection electrodes, then all the first positive split electrodes 51A and the third positive split electrodes 53A provided on different piezoelectric layers 41 can be connected together. A similar discussion applies to the negative electrode layers 6. That is, providing only one of the first negative side-connection electrode 71A− or the third negative side-connection electrode 73A− may be sufficient.

While the fourth embodiment has been described in terms of two series-connected actuator bodies 4P and 4Q, a drive unit may be configured such that more than two actuator bodies 4 are connected together in series, and the stage 11 is driven by the more than two actuator bodies 4. Specifically, a first through an n-th actuator bodies 4 (where n is an integer greater than two) are provided, and the first and the third negative split electrodes 61A and 63A of the negative electrode layers 6 of the first actuator body 4 and the first and the third positive split electrodes 51A and 53A of the positive electrode layers 5 of the second actuator body 4 are connected together in series; the first and the third negative split electrodes 61A and 63A of the negative electrode layers 6 of the second actuator body 4 and the first and the third positive split electrodes 51A and 53A of the positive electrode layers 5 of the third actuator body 4 are connected together in series; . . . ; and the first and the third negative split electrodes 61A and 63A of the negative electrode layers 6 of the (n−1)th actuator body 4 and the first and the third positive split electrodes 51A and 53A of the positive electrode layers 5 of the n-th actuator body 4 are connected together in series. Concurrently, the second and the fourth negative split electrodes 62B and 64B of the negative electrode layers 6 of the first actuator body 4 and the second and the fourth positive split electrodes 52B and 54B of the positive electrode layers 5 of the second actuator body 4 are connected together in series; the second and the fourth negative split electrodes 62B and 64B of the negative electrode layers 6 of the second actuator body 4 and the second and the fourth positive split electrodes 52B and 54B of the positive electrode layers 5 of the third actuator body 4 are connected together in series; . . . ; and the second and the fourth negative split electrodes 62B and 64B of the negative electrode layers 6 of the (n−1)th actuator body 4 and the second and the fourth positive split electrodes 52B and 54B of the positive electrode layers 5 of the n-th actuator body 4 are connected together in series.

In sum, as described above, a first pair of negative split electrodes of the i-th actuator body 4 (where i=1, . . . , n−1) and a first pair of positive split electrodes of the (i+1)th actuator body 4 are connected together in series, and a second pair of negative split electrodes of the i-th actuator body 4 and a second pair of positive split electrodes of the (i+1)th actuator body 4 are connected together in series. That is, the split electrodes supplied with the first AC voltage of the i-th actuator body 4 and the split electrodes supplied with the first AC voltage of the (i+1)th actuator body 4 are connected together in series, and the split electrodes supplied with the second AC voltage of the i-th actuator body 4 and the split electrodes supplied with the second AC voltage of the (i+1)th actuator body 4 are connected together in series.

In the fourth embodiment, the first and the third positive split electrodes 51A and 53A of a positive electrode layer 5 form a first pair of positive split electrodes; the second and the fourth positive split electrodes 52B and 54B of a positive electrode layer 5 form a second pair of positive split electrodes; the first and the third negative split electrodes 61A and 63A of a negative electrode layer 6 form a first pair of negative split electrodes; and the second and the fourth negative split electrodes 62B and 64B of a negative electrode layer 6 form a second pair of negative split electrodes. The configurations of the first pair of positive split electrodes, the second pair of positive split electrodes, the first pair of negative split electrodes, and the second pair of negative split electrodes are not limited thereto, as long as the first pair of positive split electrodes are supplied with the first AC voltage, the second pair of positive split electrodes are supplied with the second AC voltage, the first pair of negative split electrodes are opposed to the first pair of positive split electrodes across a piezoelectric layer 41, and the second pair of negative split electrodes are opposed to the second pair of positive split electrodes across a piezoelectric layer 41.

It is to be understood that the foregoing embodiments are provided as essentially preferred examples, and are not intended to limit the scope of the invention, application of the invention, or use of the invention.

As described above, the technology disclosed herein is useful for a vibratory actuator having a piezoelectric element.

The present invention is not limited to the particular embodiments disclosed, and may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes and modifications which come within the meaning and range of equivalency of the claims are to be embraced within their scope.

What is claimed is:

1. A vibratory actuator, comprising:
a piezoelectric element configured by alternately stacking a plurality of piezoelectric layers and a plurality of electrode layers, wherein
each of the piezoelectric layers includes a pair of principal surfaces and side surfaces formed along the periphery of the pair of principal surfaces, and is polarized along a direction in which the pair of principal surfaces face each other,
the plurality of electrode layers include a positive electrode layer, which serves as an anode when a voltage is applied in a forward direction with respect to the polarization direction of a corresponding one of the piezoelectric layers, and a negative electrode layer, which serves as a cathode when a voltage is applied in a forward direction with respect to the polarization direction of a corresponding one of the piezoelectric layers, the positive electrode layer includes four positive split electrodes respectively provided in four regions obtained by halving a principal surface of the piezoelectric layer respectively in the longitudinal and the lateral directions thereof, and a positive diagonal-connection electrode connecting together a first pair of positive split electrodes disposed along one diagonal direction among the four positive split electrodes; and a second pair of positive split electrodes, which are not connected together by the positive diagonal-connection electrode among the four positive split electrodes, are connected together outside the positive electrode layer, and the negative electrode layer includes four negative split electrodes opposed to the four positive split electrodes of the positive electrode layer across the piezoelectric layer, and a negative diagonal-connection electrode connecting together a first pair of negative split electrodes disposed along one diagonal direction among the four negative split electrodes; and a second pair of negative split electrodes, which are not connected together by the negative diagonal-connection electrode among the four negative split electrodes, are connected together outside the negative electrode layer.

2. The vibratory actuator of claim 1, wherein
multiple ones of the positive and the negative electrode layers are provided, on the side surfaces of the piezoelectric layers, a side-connection electrode which connects together at least one of the positive split electrodes of the first pair formed on each of different ones of the positive electrode layers, a side-connection electrode which connects together one of the positive split electrodes of the second pair formed on each of different ones of the positive electrode layers, and a side-connection electrode which connects together the other of the positive split electrodes of the second pair formed on each of different ones of the positive electrode layers are formed, on at least one of the principal surfaces having neither positive electrode layer nor negative electrode layer thereon, of the principal surfaces of the piezoelectric layers, a positive external-connection electrode which connects together the side-connection electrode connected to the one of the positive split electrodes of the second pair and the side-connection electrode connected to the other of the positive split electrodes of the second pair is formed, the second pair of positive split electrodes are connected together outside the positive electrode layer through the side-connection electrodes and the positive external-connection electrode, on the side surfaces of the piezoelectric layers, a side-connection electrode which connects together at least one of the negative split electrodes of the first pair formed on each of different ones of the negative electrode layers, a side-connection electrode which connects together one of the negative split electrodes of the second pair formed on each of different ones of the negative electrode layers, and a side-connection electrode which connects together the other of the negative split electrodes of the second pair formed on each of different ones of the negative electrode layers are formed, on at least one of the principal surfaces having neither positive electrode layer nor negative electrode layer thereon, of the principal surfaces of the piezoelectric layers, a negative external-connection electrode which connects together the side-connection electrode connected to the one of the negative split electrodes of the second pair and the side-connection electrode connected to the other of the negative split electrodes of the second pair is formed, and the second pair of negative split electrodes are connected together outside the negative electrode layer through the side-connection electrodes and the negative external-connection electrode.

3. The vibratory actuator of claim 2, wherein
both the positive and negative external-connection electrodes are respectively formed on principal surfaces of multiple ones of the piezoelectric layers.

4. The vibratory actuator of claim 2, wherein
the positive and negative external-connection electrodes are respectively formed on principal surfaces of different ones of the piezoelectric layers.

5. The vibratory actuator of claim 1, wherein
a diagonal direction along which the first pair of positive split electrodes are disposed and a diagonal direction along which the first pair of negative split electrodes are disposed are substantially parallel with each other.

6. The vibratory actuator of claim 5, wherein
the positive and the negative diagonal-connection electrodes are out of alignment with respect to each other as viewed in a stacking direction.

7. The vibratory actuator of claim 5, wherein
the positive and the negative diagonal-connection electrodes do not overlap each other as viewed in a stacking direction.

8. The vibratory actuator of claim 2, wherein
the thicknesses of the one or more piezoelectric layers on which the positive and negative external-connection electrodes are formed are greater than those of the other piezoelectric layers.

9. The vibratory actuator of claim 1, further comprising:
driving elements provided on the piezoelectric element, wherein
the piezoelectric element produces vibration which is combination of stretching vibration and bending vibration to allow an orbital movement of the driving elements, and outputs driving force.

10. A drive unit, comprising:
a vibratory actuator; and
a control unit configured to adjust a voltage and apply the voltage to the vibratory actuator to control the vibratory actuator,
wherein
the vibratory actuator includes n (where n is an integer more than 1) piezoelectric elements of claim 1, and
the first pair of negative split electrodes disposed along one diagonal direction of an i-th (i=1, ..., n−1) piezoelectric element and the first pair of positive split electrodes of an (i+1)th piezoelectric element are connected together, and the second pair of negative split electrodes disposed along the other diagonal direction of the i-th piezoelectric element and the second pair of positive split electrodes of the (i+1)th piezoelectric element are connected together.

* * * * *